United States Patent [19]

Bisher

[11] Patent Number: 5,416,416
[45] Date of Patent: May 16, 1995

[54] METHOD AND APPARATUS FOR TESTING AN AUXILIARY POWER SYSTEM

[76] Inventor: Roger C. Bisher, 998 Bankhead Hwy., SE., Mableton, Ga. 30059

[21] Appl. No.: 840,786

[22] Filed: Feb. 24, 1992

[51] Int. Cl.$^6$ .................................. G01N 27/416
[52] U.S. Cl. ................................. 324/426; 363/79
[58] Field of Search ............. 324/426, 429, 158 MG; 320/14, 32, 39, 44; 340/636; 363/74–79

[56] References Cited

U.S. PATENT DOCUMENTS

| | | | |
|---|---|---|---|
| 2,079,500 | 5/1937 | Foos | 320/32 |
| 2,517,575 | 8/1950 | Kelly | 363/74 |
| 3,348,060 | 10/1967 | Jamieson | 307/66 |
| 3,356,930 | 12/1967 | Lupoli et al. | 363/74 |
| 3,500,167 | 3/1970 | Applegate et al. | 320/14 |
| 3,535,608 | 10/1970 | Cramer et al. | 320/14 |
| 3,659,184 | 4/1972 | Schwarz | 363/78 |
| 3,758,839 | 9/1973 | Medlar | 320/32 |
| 4,037,156 | 7/1977 | Goujon et al. | 324/73.1 |
| 4,065,711 | 12/1977 | Kawabata | 320/14 |
| 4,146,958 | 2/1979 | Groeschel | 320/14 |
| 4,272,716 | 6/1981 | Etienne | 320/14 |
| 4,302,714 | 11/1981 | Yefsky | 320/5 |
| 4,321,523 | 3/1982 | Hammel | 320/14 |
| 4,335,344 | 6/1982 | Gant | 320/32 |
| 4,352,067 | 9/1982 | Ottone | 324/429 |
| 4,423,379 | 12/1983 | Jacobs et al. | 324/429 |
| 4,507,722 | 3/1985 | Dewan et al. | 363/79 |
| 4,536,696 | 8/1985 | Ray | 320/27 |
| 4,629,964 | 12/1986 | Ball | 320/32 |
| 4,639,655 | 1/1987 | Westhaven et al. | 320/14 |
| 4,739,225 | 4/1958 | Roberts et al. | 363/74 |
| 4,755,733 | 7/1988 | Laliberté | 320/14 |
| 5,039,931 | 8/1991 | Weiland | 320/32 |
| 5,041,959 | 8/1991 | Walker | 363/79 |
| 5,111,148 | 5/1992 | Senoo et al. | 324/429 |
| 5,220,495 | 6/1993 | Zulaski | 320/32 |
| 5,285,367 | 2/1994 | Keller | 363/78 |

OTHER PUBLICATIONS

Victor Wouk, *High Efficiency, High Power, Load Insensitive DC Chopper for Electronic Automobile Speed Control*, IEEE Conference Record of Fourth Annual Meeting of Industry and General Applications Group, pp. 393–402 (1969)–Dec.

*Primary Examiner*—Maura K. Regan
*Attorney, Agent, or Firm*—Jones & Askew

[57] ABSTRACT

A load test system for testing an engine/generator (12) and battery set (14) of a backup power system by simulating a load with desired linear, non-linear and/or reactive load characteristics. The load test system also recharges the battery set (14) after testing. Battery imbalance circuit (40) is connected to battery set (14) to determine whether bad cells are present therein. Controller (110) uses signals from current monitors (24, 125) to monitor the current, and isolation transformer (47) to monitor the AC line voltage. The controller (110) simulates a desired load by causing a rectifier (200) comprising thyristors to turn on at a selected point on the AC waveform and/or by causing a load bank (300) to draw a predetermined load current when a predetermined load voltage is present. Capacitive load circuit (28) selectively places a large capacitance across the DC bus (203). When the capacitance is present, surge current at thyristor turn-on simulates a non-linear or reactive load. The amount of surge current is determined by the turn-on point of the thyristors, the value of the capacitance, and the degree of discharge caused by the load bank (300).

16 Claims, 13 Drawing Sheets

METHOD AND APPARATUS FOR TESTING AN AUXILIARY POWER SYSTEM

Technical Field

This invention relates generally to power system testing apparatus and, in particular, relates to apparatus used to test the auxiliary power systems of facilities that require an uninterrupted source of power.

BACKGROUND OF THE INVENTION

Certain facilities, such as large data processing centers, require a continuous supply of power. In order to assure a continuous supply of power, these facilities rely upon an auxiliary or backup power system, such as an uninterruptible power system (UPS). In addition to the UPS, one or more internal combustion engine-driven generators may be utilized for UPS support during extended power outages. Typically, a facility depends upon the public utility to provide for its day-to-day power demands. The UPS provides continuous power to feed the critical loads through a system generally comprising a rectifier, batteries and inverter. Upon the occurrence of a power failure at the public utility, the batteries serve as a power source for a very short duration, a maximum of fifteen minutes, typically. This allows the engine/generator time to come on line and to take over as the substitute power source until power from the public utility is restored. In the cases where an engine/generator is not part of the power system, or fails to come on line, the batteries supply enough power to allow the facility or the data processing center to execute an orderly shut down procedure so that there will be no loss or a minimal loss of information.

The proper functioning of the backup power system is critical. The backup power system must always be in a state of readiness to take over the power supply function from the public utility. However, in some cases, little or no attention is paid to the operational readiness status of the backup system, despite its critical function. The neglect of the backup system can result in the complete loss of power during a public utility power outage. The consequent dangers include irretrievable loss of data if a computer system depends upon the backup system for power delivery. Further, in some facilities, such as hospitals, the failure of the backup system can result in serious personal injury or death.

Periodic testing of the backup power system is a requisite for those facilities which require a continuous source of power. Further, whenever the load that the facility puts on the power system is changed, especially when the load is increased, the backup power system must be tested in order to determine whether the backup system can handle the changed load. However, testing a backup power system poses several problems. A test which simply switches the facility's on-line load to the backup system to see if it can handle the load is not always desirable. Such a test could prove disastrous if the backup system is not functioning properly or if it is inadequate for the load. Also, disconnecting the backup system in order to conduct testing is not usually a feasible option as the facility would not have a substitute for the public utility power in the case of a power outage during testing. Thus, testing of the backup facility must be done on-site, without interrupting the commercial power supply to the facility, and without disconnecting the backup system from the facility.

The proper testing of a backup power system includes testing all major functions of the backup system and testing such functions in a way so as to duplicate the anticipated load as accurately as possible. In a backup power system comprising an engine/generator and UPS/battery set, both parts of the system must be tested. Prior art testing devices typically only test the battery set of a backup system. Generally, prior art devices use conventional battery testers to test each separate cell of the batteries. Such individual cell testing does not adequately test cell connections under load conditions, does not adequately assess the performance of the battery set as a unit, and does not provide comprehensive testing of the complete backup power system.

Further, to properly test the engine/generator system it must be evaluated with a test load simulating the load which the backup system would have to service in the case of a power outage. Generally, the load to be serviced is a nonlinear and/or reactive load. However, prior art testing devices typically test backup power systems with a simple unity power factor resistive load. This type of testing is inadequate to determine whether a backup system will function properly when servicing the actual, nonlinear and/or reactive load in an emergency situation.

Further, prior art testing devices have been complicated, specialized devices which require highly skilled personnel for their administration. Testing the backup system has been a burden to the serviced facility in that such testing diverts already strained personnel resources and requires the skill of highly trained individuals to set up and administer the test. Often, where the facility is in continuous operation, there is no time which is convenient for testing the backup system. As a result of these problems, most backup power systems are rarely tested, or inadequately tested, and often, tested only through the actual occurrence of an emergency.

Thus, there is a need in the art for a method and an apparatus to completely and accurately test the load capability of a backup power system comprising an engine/generator and a UPS, including a set of batteries.

Further, there is a need in the art for a method and an apparatus to test the backup power system with a load that simulates the load of the serviced facility.

In particular, there is a need in the art for a method and an apparatus to test the backup power system with a nonlinear and/or reactive load which simulates the load which would be actually carried by the power system.

There is also a need in the art for a means to test the battery set of a backup power system under load conditions by testing the battery set as a unit under constant kilowatt load conditions.

In addition, there is a need in the art for a method and an apparatus to test the backup power system quickly, conveniently and without disrupting the operations of the facility served by the backup power system.

SUMMARY OF THE INVENTION

The present invention provides a method and an apparatus for testing an AC power source, such as an engine-driven generator, by simulating a load with desired characteristics including linear, non-linear, and reactive load characteristics. The present invention also provides a method and an apparatus for testing a DC power source by simulating a load with desired characteristics. In addition, the present invention provides a method and an apparatus for recharging a battery set with an AC power source.

Stated generally, the present invention provides an apparatus for testing an AC power source, the apparatus including a controller, a rectifier, a load bank, means for providing load current signals and means for providing load voltage signals. In response to user input signals, and the provided load current signals and load voltage signals, the controller provides first control signals to the rectifier and second control signals to the load bank. The rectifier is connected to the AC power source. In response to the first control signals from the controller, the rectifier simulates a first set of load characteristics by rectifying power provided by the AC power source at a selectable point on the AC waveform. In the preferred embodiment, the rectifier simulates predetermined non-linear load characteristics. In another embodiment, the rectifier simulates predetermined reactive load characteristics. The rectifier comprises a thyristor group in the preferred embodiment. The load bank is connected to the rectifier. In response to the second control signals from the controller, the load bank simulates a second set of load characteristics. In the preferred embodiment, the load bank simulates predetermined linear load characteristics. In one embodiment, the load bank comprises a first load group. In the preferred embodiment, the load bank comprises a first load group, and a second load group connected in parallel with the first load group.

The present invention also provides a method for testing an AC power source by simulating a load with desired characteristics comprising the steps of: providing first control signals and second control signals in response to current signals, load voltage signals and user input signals, where the user input signals correspond to the desired characteristics of the load; simulating a first set of load characteristics by rectifying power provided by the AC power source at selected points on the AC waveform in response to the first control signals; simulating a second set of load characteristics by a load bank in response to the second control signals; providing load current signals in response to the current drawn by the load bank; and providing load voltage signals in response to the voltage across the load bank. In the preferred embodiment, the step of simulating the first set of load characteristics comprises simulating predetermined non-linear load characteristics. Also in the preferred embodiment, the step of simulating the second set of load characteristics comprises simulating predetermined linear load characteristics. In another embodiment, the step of simulating the first set of load characteristics comprises simulating predetermined reactive load characteristics.

The present invention also provides an apparatus for testing a DC power source, including a controller, a load bank, a current monitor and a voltage monitor. The current monitor monitors the current provided by the DC power source and provides current level signals to the controller. The current monitor is connected in series with the load bank. The voltage monitor monitors the voltage provided by the DC power source and provides voltage level signals to the controller. In response to the current level signals, the voltage level signals, and user input signals, the controller provides control signals to a load bank. The user input signals correspond to nominal parameters of the DC power source. In response to the control signals from the controller, the load bank draws current from the DC power source. In one embodiment of the present invention the load bank comprises a first load group. In the preferred embodiment the load bank comprises a first load group and a second load group which is connected in parallel with the first load group.

In addition, the present invention provides a method for testing a DC power source by simulating a load with desired characteristics, comprising the steps of providing user input signals where the user input signals correspond to nominal parameters of the DC power source and to the desired characteristics of the load; simulating load characteristics by a load bank in response to control signals; drawing current from the DC power source in response to the control signals; monitoring the current level from the DC power source; providing current level signals; monitoring the output voltage from the DC power source; providing voltage level signals; and providing control signals in response to the current level signals and the voltage level signals. In the preferred embodiment, the step of simulating the load characteristics comprises applying a predetermined load to the output of the DC source.

Further, the present invention provides an apparatus For recharging a DC power source with an AC power source including a current monitor, a voltage monitor, a controller, and a rectifier. The current monitor monitors current level provided to the DC power source and provides current level signals. The voltage monitor monitors the voltage level provided to the DC power source and provides voltage level signals. In response to the current level signals, the voltage level signals and user input signals, which correspond to nominal parameters of the DC power source, the controller provides signals to the rectifier. In response to the control signals from the controller, the rectifier provides DC power to the DC power source by rectifying the AC power provided by the AC power source. In the preferred embodiment the rectifier comprises a thyristor group.

Another method provided by the present invention is what of recharging a DC power source with an AC power source comprising the steps of providing user input signals, where a the user input signals correspond to the nominal parameters of the DC power source; providing AC power by the AC power source; rectifying the AC power to DC power; providing the DC power to the DC power source; monitoring current level provided to the DC power source; providing the current level signals; monitoring the voltage level provided to the DC power source; providing the voltage level signals; and providing control signals in response to the user input signals, the current level signals and voltage level signals.

The present invention may also be used as an information gathering source with respect to the backup system tested. The present invention can obtain, test and present data regarding the tested backup system including data on load vs. time, frequency vs. time, voltage transients vs. time and operator selected test parameters. Data collection includes fourier analysis to provide information on harmonic levels and total harmonic distortion generated by testing of the backup system.

Thus, it is an object of the present invention to provide a method and an apparatus to test an AC power source by simulating a load with desired characteristics such as linear, nonlinear and/or reactive characteristics of an actual load.

It is a further object of the present invention to provide a method and an apparatus for duplicating the power consumption characteristics of the actual load.

It is a further object of the present invention to provide a method and an apparatus for testing a DC power source such as a battery set under constant power load conditions.

It is a further object of the invention to provide a method and an apparatus for recharging the DC power source such as a battery set after it has been tested.

It is a further object of the present invention to provide a method and an apparatus for testing a power source quickly, conveniently and without disrupting the operations of the facility served by the power source.

It is a further object of the present invention to provide a method and an apparatus for testing a power source which may be operated without difficulty and without a high degree of specialized skill.

Other objects, features and advantages of the present invention will become apparent upon reading the following detailed description of embodiments of the invention, when taken in conjunction with the accompanying drawing and the appended claims.

DETAILED DESCRIPTION

Figure 1:
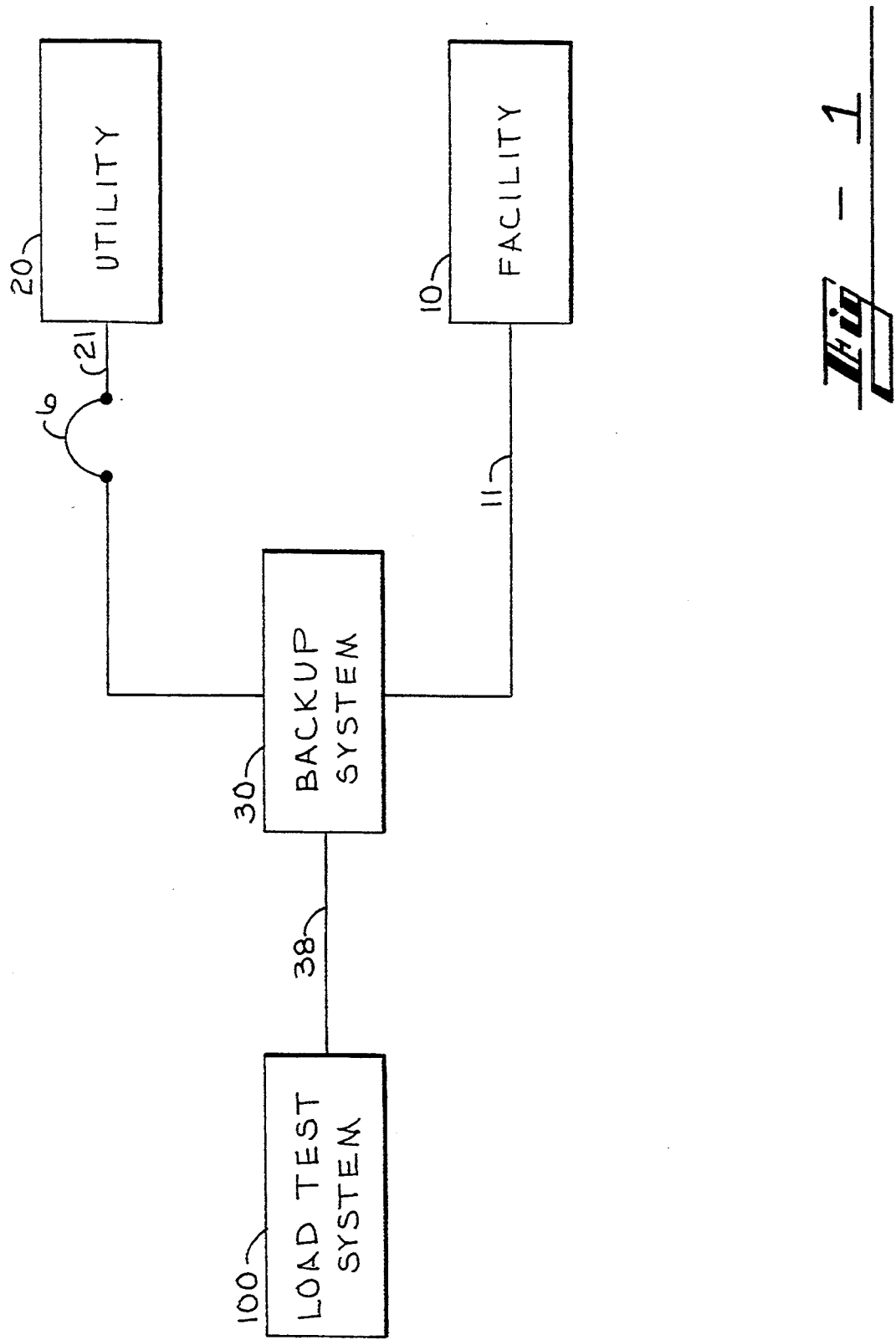
FIG. 1 is a block diagram illustrating the preferred environment of the present invention.

Referring now to the drawing, in which like numerals indicate like elements through the several figures, FIG. 1 is a block diagram illustrating the preferred environment of the present invention, which is a method and an apparatus for testing the backup power system 30 servicing a facility 10. The serviced facility 10 may be a hospital or a large data processing center, or possibly a financial institution which requires a continuous supply of power.

Generally, the day-to-day power demands of a facility 10 are serviced by a public utility 20. In the case of a failure on the part of the public utility 20, a backup system 30 supplies power to the facility 10. As shown in FIG. 1, utility 20 is connected by line 21 and circuit breaker 6 to the backup system 30. When the backup power system 30 is to be tested, the load test system 100 of the present invention is connected to the backup power system 30 via line 38. During testing, the facility 10 remains linked to the public utility 20 and to backup system 30. Thus, testing does not cause an interruption of the facility's power supply.

Figure 2:
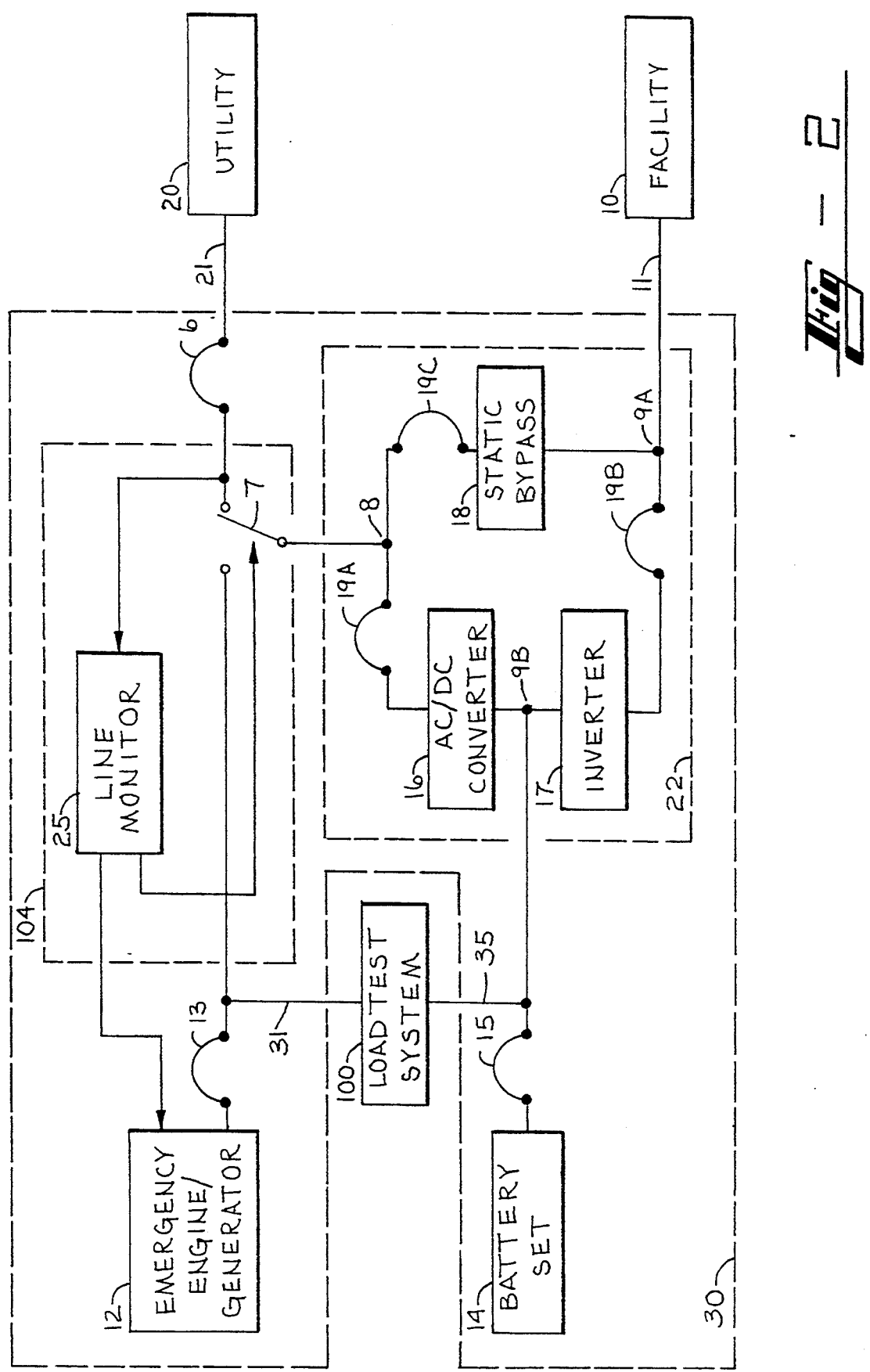
FIG. 2 is a detailed block diagram illustrating the preferred environment of the present invention.

FIG. 2 is a detailed block diagram illustrating the preferred environment of the present invention, and illustrates the general configuration of backup system 30 and its relationship to facility 10, utility 20 and load test system 100. Backup system 30 includes an emergency engine/generator 12, battery set 14, and select circuit 22. However, every backup system may not include a battery set. Nevertheless, the present invention may be used to run AC load tests on backup engine-generator systems without battery sets. Select circuit 22 is connected to utility 20 by switch 7 during normal operation. Automatic transfer switch assembly 104 comprises switch 7 and line monitor 25. Line monitor 25 is used to monitor the supply of power from the public utility 20, and is typically part of the automatic transfer switch assembly. The construction and operation of line monitor 25 is well known to those skilled in the art. In the case of a prolonged power failure on the part of the public utility 20, line monitor 25 activates engine/generator 12 and causes switch 7 to switch the facility 10 to the backup power system 30 for a supply of power. In the case of a power failure, select circuit 22 is connected to engine/generator 12 by switch 7. Select circuit 22 includes AC/DC converter 16, inverter 17 and static bypass 18. In select circuit 22, the series combination of static bypass 18 and circuit breaker 19C is connected in parallel across the series combination of circuit breaker 19A, AC/DC converter 16, inverter 17 and circuit breaker 19B. In select circuit 22, switch 7 is connected at junction point 8 of the parallel combination described above between circuit breakers 19A and 19C. Battery set 14 is connected to select circuit 22 at junction point 9B between the series combination of AC/DC converter 16 and inverter 17. Facility 10 is connected to backup system 30 at junction 9A of circuit breaker 19B and static bypass 18.

The function of the AC/DC converter 16 in select circuit 22 is two-fold. It converts the AC line voltage to battery voltage through circuit breaker 19A in order to charge battery set 14, and in order to power the facility 10 through inverter 17 and circuit breaker 19B. Thus, if there is a power failure at the public utility 20, power to the facility 10 will not be interrupted because the battery set 14 will continue to provide power to facility 10 through inverter 17. In case of a short or other failure with respect to battery set 14, AC/DC converter 16 or the inverter 17, the static bypass 18 connects the facility 10 to the AC line through circuit breaker 19C within a fraction of a cycle.

Figure 3:
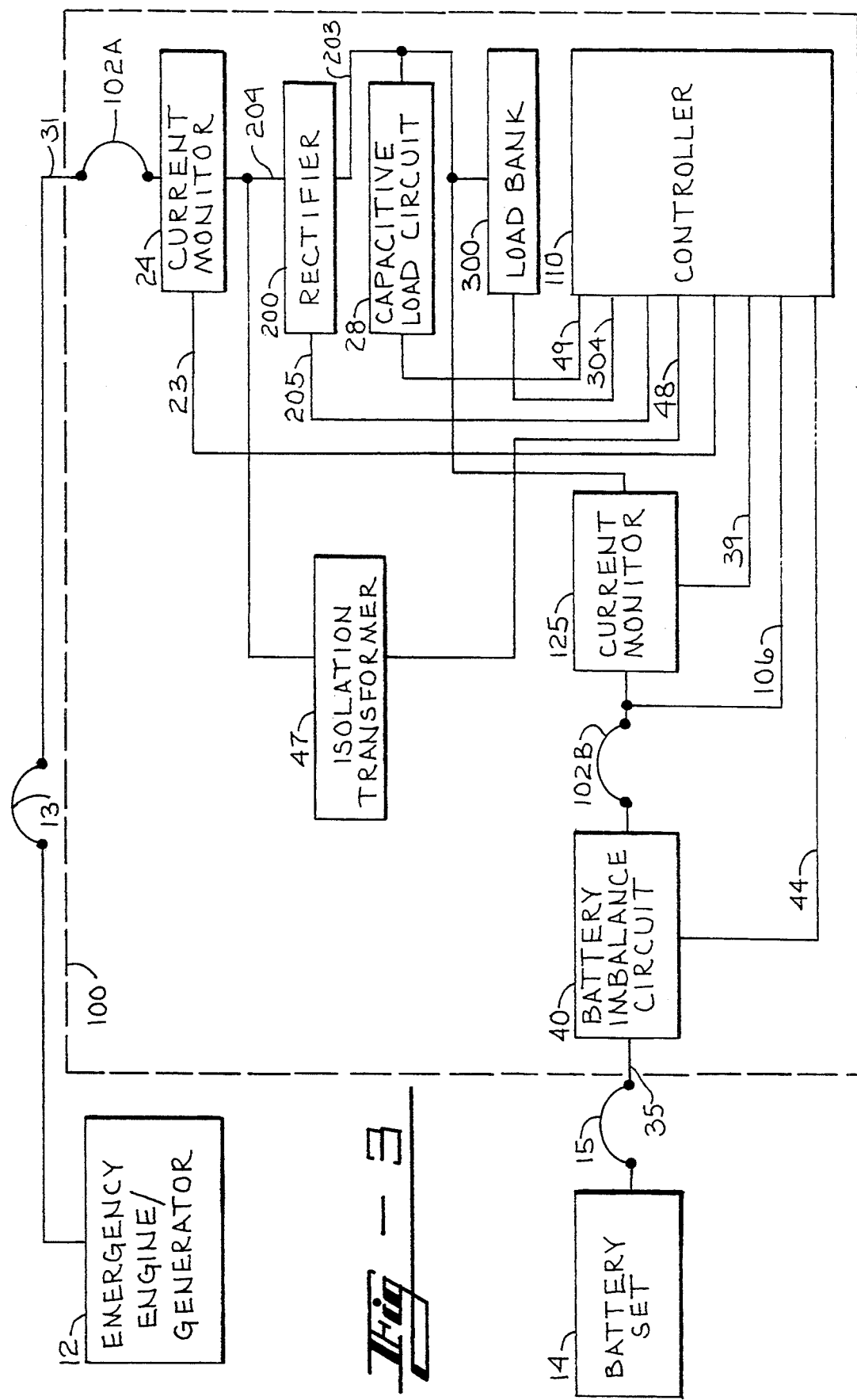
FIG. 3 is a block diagram of the preferred embodiment of the present invention.

FIG. 3 illustrates generally the preferred embodiment of the present invention. When testing of the backup power system 30 or battery recharging is to take place, emergency engine/generator 12 is connected to circuit breaker 102A of load test system 100 through circuit breaker 13 via line 31. Battery set 14 is connected to battery imbalance circuit 40 of load test system 100 through circuit breaker 15 via line 35. Circuit breaker 102A and battery imbalance circuit 40 are the end points of the series combination of the major elements of the preferred embodiment of the present invention. Circuit breaker 102A is connected in series with current monitor 24, which is connected in series via bus 204 with rectifier 200, which is connected in series via bus 203 with capacitive load circuit 28, load bank 300 and, via bus 105, with current monitor 125. Current monitor 125 is connected in series with circuit breaker 102B, which is connected in series with battery imbalance circuit 40.

Control signals are provided to and received from certain elements by controller 110 in the preferred embodiment. Current monitor 24 monitors the AC current coming into load test system 100 and provides current level signals to controller 110 on line 23. Voltage level signals corresponding to the AC line voltage on bus 204 are provided to the controller on line 48 through isolation transformer 47. Rectifier 200 receives signals from controller 110 on line 205. Switching circuit 28 receives signals from controller 110 on line 49. Load bank 300 receives signals from controller 110 on line 304. Current monitor 125 monitors the DC circuit into or out of the battery set 14 and provides signals to controller 110 on line 39. Voltage level signals on bus 105 corresponding to the DC (battery set) voltage are provided to the controller on line 106. Battery imbalance circuit 40 provides signals to controller 110 on line 44.

Load test system 100 of the present invention generally comprises a controller 110, rectifier 200, and load bank 300. In testing the backup system's engine/generator 12, the load test system 100 simulates the nonlinear and/or reactive load of the serviced facility 10 by adjusting its load bank 300 for the desired load and by adjusting its rectifier 200 for the desired nonlinear and/or reactive effect. In testing the backup system's battery set 14, the load test system 100 adjusts its load bank 300 to simulate the load which would be drawn by the UPS inverter 17 if the inverter 17 were providing battery backup power to the serviced facility 10. In battery recharge mode, load test system 100 recharges battery set 14 by rectifying AC power provided by emergency engine/generator 12 or by the utility 20 and providing it to battery set 14.

Figure 4:
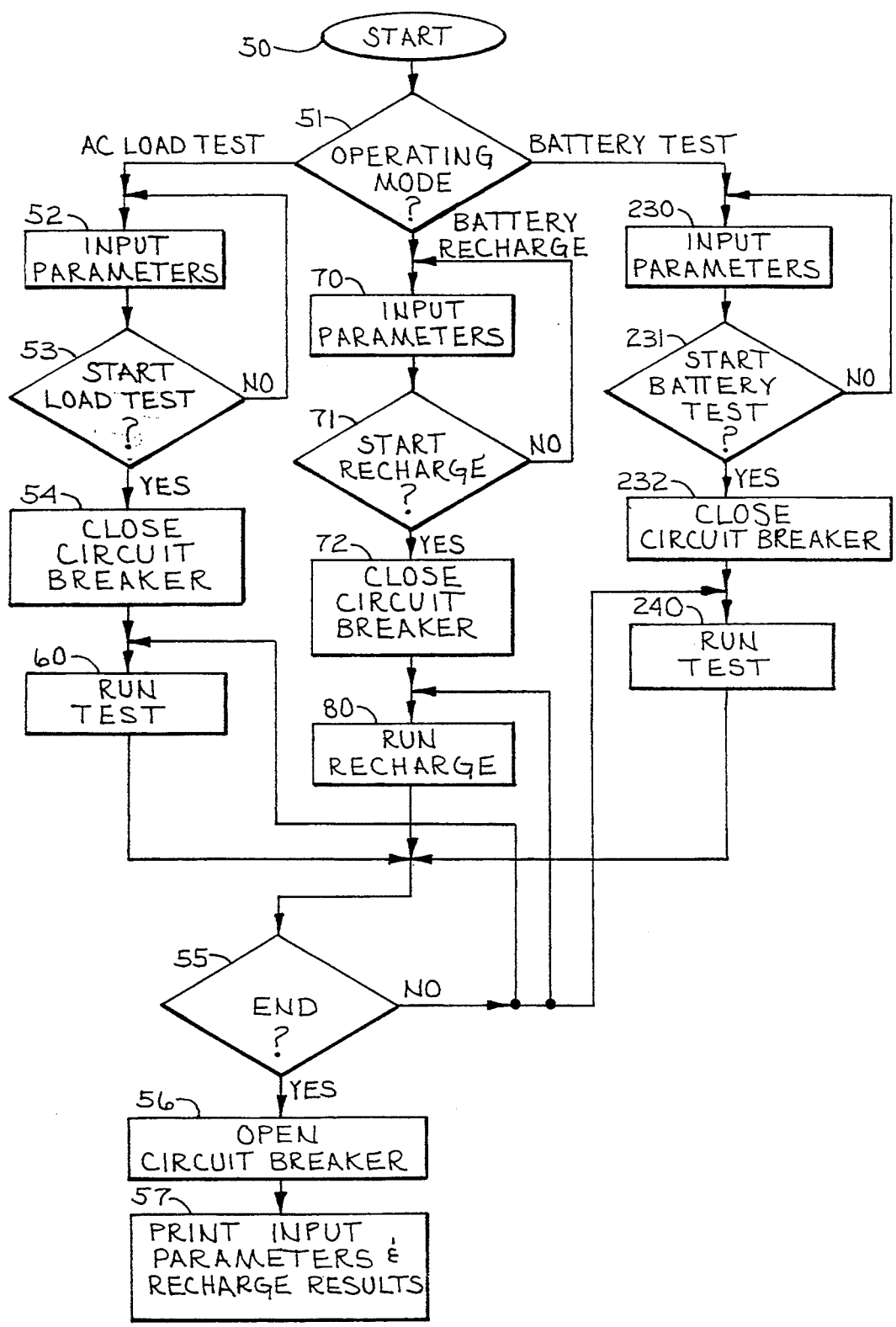
FIG. 4 is a flow chart illustrating the general method of the operation of the preferred embodiment.

FIG. 4 is a flow chart illustrating the general method of operation of the preferred embodiment, which is entered at start block 50. At step 51, a choice is presented to the user as to the desired operating mode of the present invention: AC load test; battery recharge; or battery test. If the AC load test is chosen, at step 52 input parameters for the test are entered. For the AC load test, input parameters may include output voltage, output current, power factor, maximum rated output current, rated output voltage at maximum rated output current, range of power factors, and other operator selectable parameters. The input parameters correspond to desired characteristics of the simulated load.

Based upon the input parameters, the controller 110 sets up initial values for the load bank 300 and rectifier 200. The initial values are determined by calculations or look up tables in the ROM of the controller 110. The actual equations and ROM look up tables are determined empirically based upon the range of load resistance values available, the value of capacitor 28B, (FIG. 5) and the maximum allowable current for the rectifier 200. At step 53, a decision is made whether to start the load test. If the decision is against starting the load test, step 52 may be repeated. If the load test is to start, the circuit breaker 13 is closed at step 54, and the test is run at step 60. More specific steps regarding the running of the AC load test are presented in connection with FIG. 6. At step 55, a decision is made whether to continue or to end the test. If the test is to be continued, the run test of step 60 is repeated. If the test is to end, circuit breaker 13 is opened in step 56, and at step 57, the input parameters and test results are printed.

Circuit breakers are manually operated and controller 110 may display, as on a CRT screen, an instruction as to whether the test person should open or close the circuit breakers.

If the battery recharge operating mode is chosen in step 51, the input parameters for the recharge are entered at step 70. For the battery recharge mode, input parameters may include maximum charging current, maximum battery voltage, voltage per cell, maximum charging current per battery, amp hour rating per battery, number of battery columns in parallel, and number of batteries in series in each column. As in the AC load test, the controller 110 sets up the initial values for the load bank 300 and rectifier 200. A decision is made at step 71 whether to proceed with the recharge. If the decision is against starting the battery recharge, step 70 may be repeated. If the recharge is to start, the circuit breaker 15 is closed at step 72, and the recharge is run at step 80. More specific steps regarding the running of the battery recharge are presented in connection with FIG. 7. At step 55, a decision is made whether to continue the recharge, and if the recharge is to be continued, the run recharge of step 80 is repeated. If the recharge is to end, circuit breaker 15 is opened in step 56, and at step 57, the input parameters and test results are printed.

The battery test follows the same general operating mode of the AC load test and the battery recharge. If the battery test is chosen at step 51, the input parameters for the test are entered at step 230. For the battery test, input parameters may include voltage per cell, amp hour rating of a battery, number of battery strings, number of batteries in series in a column, number of battery columns in parallel, and minimum output voltage at maximum rated output current. As in the AC load test, the controller 110 sets up the initial values for the load bank 300 and rectifier 200. A decision is made at step 231 whether to proceed with the test. If the decision is against starting the battery test, step 230 may be repeated. If the test is to start, the circuit breaker 15 is closed at step 232, and the test is run at step 240. More specific steps regarding the running of the battery test are presented in connection with FIG. 8. At step 55, a decision is made whether to end the test, and if the test is to be continued, the run test of step 240 is repeated. If the test is to end, circuit breaker 15 is opened in step 56, and at step 57, the input parameters and test results are printed.

Figure 5:
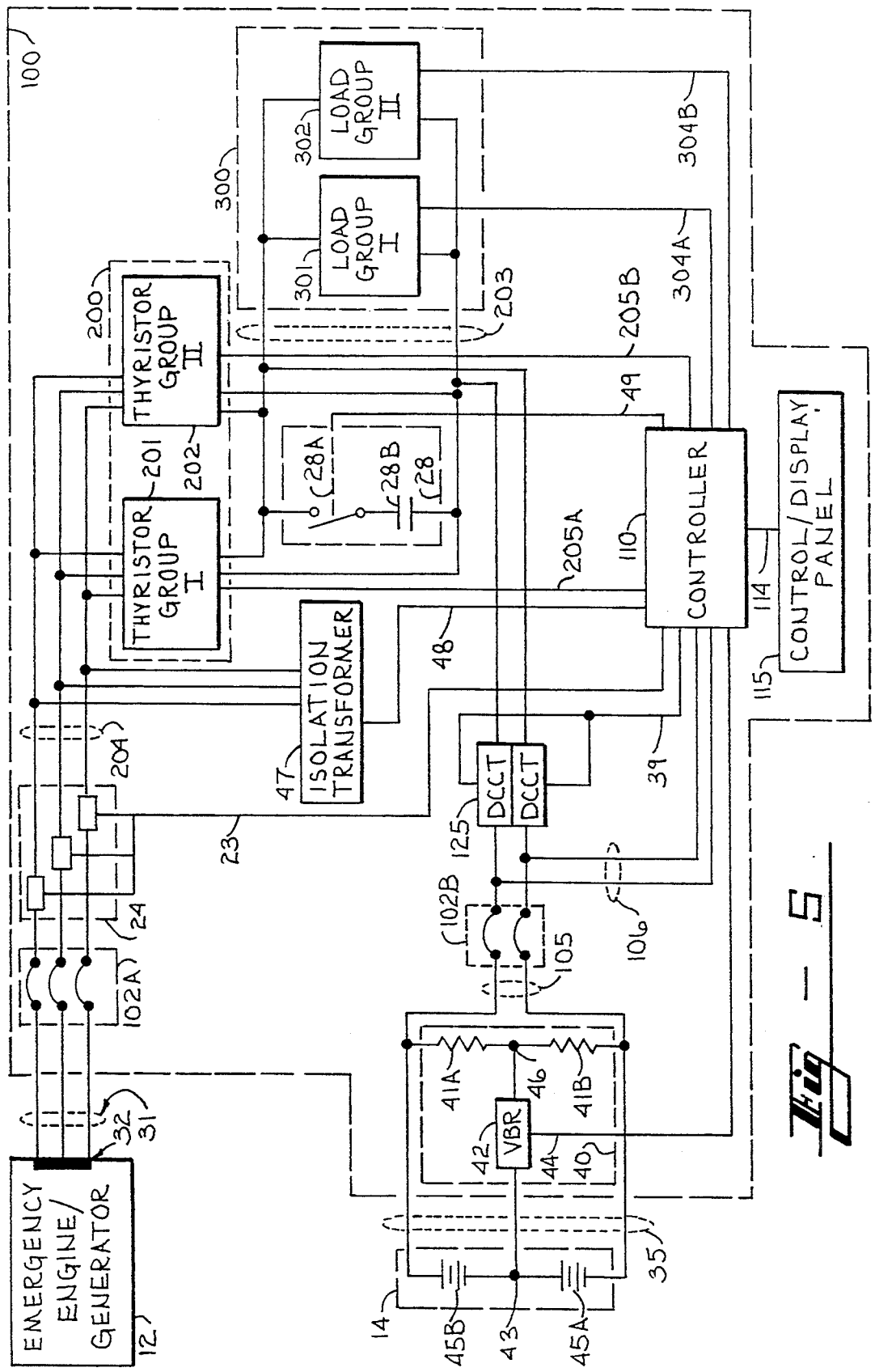
FIG. 5 is a detailed block diagram of the preferred embodiment of the present invention.

FIG. 5 is a block diagram illustrating the preferred embodiment of the present invention. The load test system 100 may be operated in the battery test mode, in the AC load test mode or the battery recharge mode. The mode selection is input through the control/display panel 115. In performing the tests on the backup system 30, the load test system 100 simulates a load matching the facility's characteristics. Thus, the operator must also determine the input parameters corresponding to the facility's load characteristics and input such information to the load test system 100. User input data and test data output from the load test apparatus 100 is made through the control/display panel 115 which is connected to the controller 110 through bus 114. In the preferred embodiment, the control/display panel 115 includes a standard computer keyboard or tactile touch screen as the input device, with an LCD, vacuum fluorescent or CRT display and a printer for providing printouts of the test data. Upon receipt of the mode selection and parameter information, the controller 110 configures the load test system 100 for the appropriate mode and load, and the test is run.

When the AC load test is run, the load test system 100 is connected to the three phase AC power output 32 of the emergency engine/generator 12 through circuit breaker 102A and lines 31. Circuit breaker 102A is closed for the AC load test and the battery recharge, but is open during testing of the backup system's battery set 14.

When the battery set 14 of the backup power system 30 is to be tested, the load test system 100 is connected to the battery set 14 by battery power bus 35 and circuit breaker 102B. Circuit breaker 102B is closed for battery set testing and the battery recharge, but is open during the AC load test. Circuit breakers 102A and 102B incorporate ground fault protection for the load test apparatus 100 in a manner described below.

As illustrated in FIG. 5, battery set 14 comprises two battery groups 45A, 45B. However, battery set 14 may have other configurations well known to those skilled in the art. Each of battery groups 45A, 45B may include multiple battery strings. The battery imbalance circuit 40 is connected across bus 35 and to the junction of battery groups 45A and 45B, and is used during battery testing and battery recharging to determine whether bad cells are present in the battery set 14. A pair of resistors 41A, 41B, having the same value, are connected in series with respect to each other, but as a pair are connected in parallel with the battery set 14. The junction point of resistors 41A, 41B is connected to one input of voltage balance relay (VBR) 42. The other input of VBR 42 is connected to the junction point 43 of battery set 14.

In a balanced battery set, the voltage across the battery set 14 is divided equally between battery groups 45A, 45B such that the voltage at junction 43 is half of the total voltage across battery set 14. Further, because resistors 41A and 41B have the same value, in a balanced battery set, the voltage at junction 46 should be the same as the voltage at junction 43. VBR 42 monitors and compares the voltages at junctions 43 and 46 and provides monitoring signals to the controller 110 on line 44. If the voltage at junction 43 is not the same as the voltage at junction 46, there may be one or more bad cells in one of the battery groups 45A, 45B. Upon receipt of bad cell indication from VBR 42, the controller 110 will halt the battery test or battery recharge, whichever is being conducted. The operator can disable this function if desired.

Figure 6:
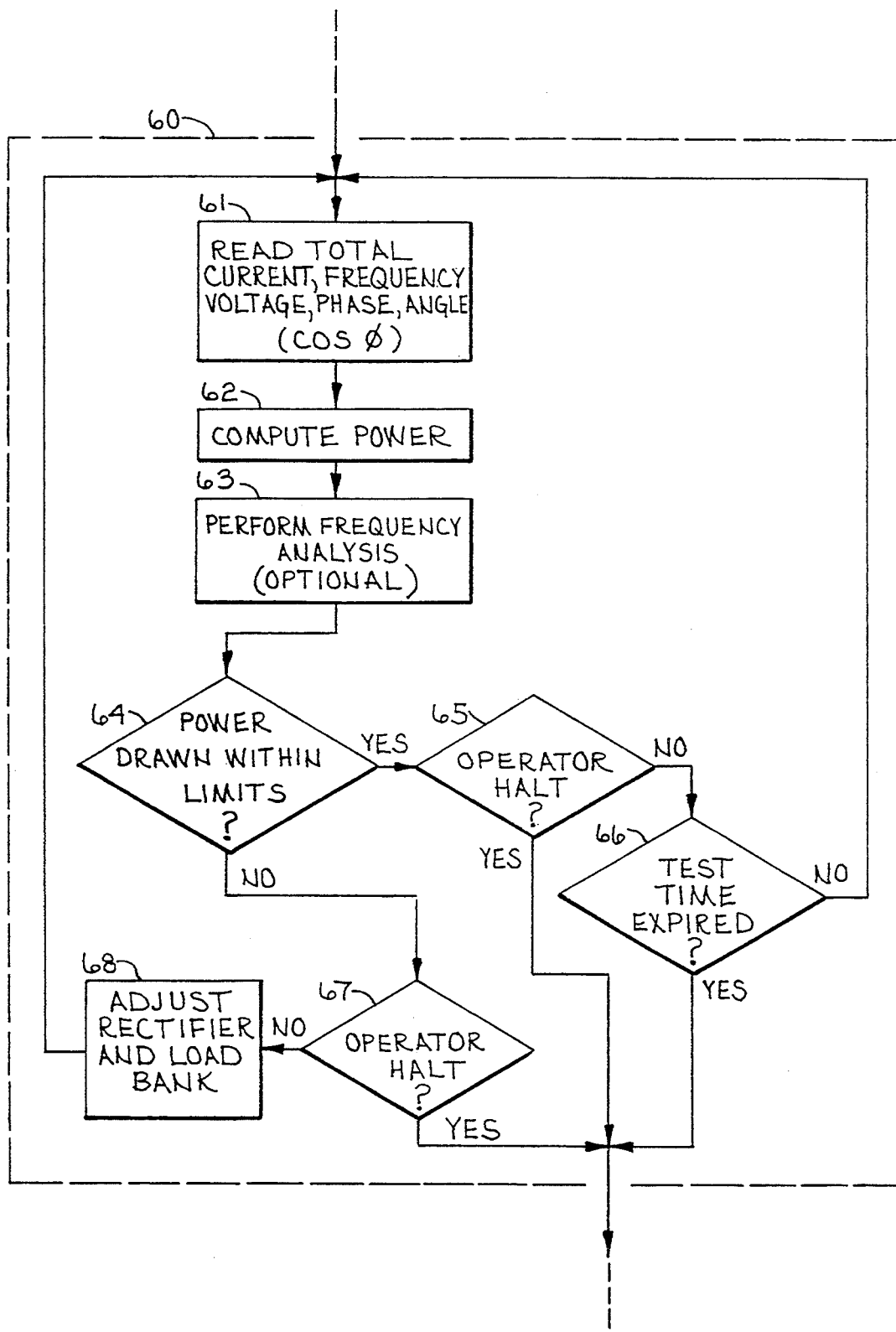
FIG. 6 is a flow chart illustrating the general method of the operation of the preferred embodiment in the AC load test mode.

FIG. 6 is a flow chart illustrating in greater detail the run test step 60 of the AC load test flow chart shown in general in FIG. 4. At step 61, the total current, frequency, voltage, and phase angle (cos theta) is read and at step 62, the load power is computed. In step 63, which is optional, frequency analysis may be performed. As is known to those skilled in the art, there are software packages available for performing frequency analysis and for displaying and printing the results of such frequency analysis. In decision step 64 the computed load power is checked to see whether the power drawn is within the predetermined limits. The predetermined limits are determined from the input parameters provided by the operator. If the power drawn is not within limits, the operator is presented with a choice in decision step 67 of ending the test by proceeding to step 55 or of adjusting the rectifier and load bank in step 68. If the decision is made to adjust the rectifier in step 68, step 61 is repeated together with the sequence of steps described above. If the decision reached in step 64 is that the power drawn is within limits, the operator is presented with the choice of halting the test in step 65. If a decision is made to halt the test, the test will end in step 55. If the test is to continue, decision step 66 checks whether the test time has expired. If the test time has expired, the test will end in step 55. If the test time has not expired, step 61 is repeated together with the sequence of steps described above.

Referring to FIG. 5, during the AC load test and battery recharge, AC power is provided through the input circuit breaker 102A and through current monitor 24 on AC power bus 204 to the rectifier 200. Current monitor 24 provides signals via line 23 to controller 110 regarding the AC current level provided to rectifier 200. In the preferred embodiment, current monitor 24 comprises window type current transformers, manufactured by Instrument Transformer, Inc., Clearwater, Fla., model 560–402, having a current step down ratio of 4000:5, relay class C50. Information regarding the voltage level on bus 204 is provided to controller 110 on bus 48 through isolation transformer 47, which isolates and steps down line-to-line voltage on bus 204. In the preferred embodiment, the isolation transformer 47 comprises AC metering potential transformers, Westinghouse model EMP-0.6, rated 5:1 ratio, 150VA thermal burden, 10KV BIL, 0.6 accuracy class.

During the AC load test, controller 110 simulates the nonlinear and/or reactive load of the serviced facility 10 by adjusting the rectifier 200 for the desired nonlinear and/or reactive effect and simulates the linear load by adjusting load bank 300 for the desired linear effect. In the preferred embodiment, the rectifier 200 comprises two independently controlled thyristor groups, 201 and 202, connected in parallel via coupled input reactors (not shown) to force thyristor load sharing. The use of reactors to cause current equalization between paralleled devices is well known. The thyristor groups, 201 and 202, are identical and are described in further detail in connection with FIG. 11 below. Two groups are used in the preferred embodiment to provide adequate current handling capacity. Controller 110 determines the point on the AC voltage waveform where the thyristors groups, 201 and 202, of the rectifier 200 are to be turned on and off in a manner to simulate desired linear and non-linear characteristics of the load. Controller 110 provides signals to each of the thyristor groups, 201 and 202, on lines 205A and 205B, respectively, to accomplish such simulation. Pursuant to the signals from controller 110, rectifier 200 selectively rectifies the power on AC power bus 204 to provide DC power on DC power bus 203.

As illustrated in FIG. 5, DC power bus 203 provides DC power from rectifier 200 to load bank 300 and capacitive load circuit 28. Capacitive load circuit 28 selectively places a large capacitance across bus 203. When the capacitance is present, surge current at thyristor turn-on simulates a non-linear or reactive load. In the preferred embodiment, capacitive load circuit 28 comprises a switch 28A and DC filter capacitor 28B. The value and current charge level of capacitor 28B, the source impedance (generator 12, busses 31,203 and 204, and rectifier 200), and the degree of discharge by load bank 300 determine the peak current that will flow at the turn-on point of each of the thyristors comprising thyristor groups 201 and 202 of rectifier 200. The total filter capacity of capacitor 28B in the preferred embodiment is 235,000 microfarads, using 100 electrolytic capacitors each being rated at 4700 microfarad, 450 WVDC. Fifty capacitors are connected in parallel, and two of these parallel groups are connected in series. Switch 28A is controlled by controller 110 via line 49. Switch 28A is preferably closed during AC load testing and battery recharge. However, switch 28A may be open during battery testing or in the event that it is desired to operate load test system 100 as close to unity power factor as possible.

As noted, during the AC load test, controller 110 simulates the desired linear or constant load or component of the simulated load by adjusting load bank 300 for the desired effect. In the preferred embodiment, load bank 300 comprises two independently controlled load groups 301, and 302 connected in parallel. The load groups, 301 and 302 are identical and are described in further detail in connection with FIG. 12 below. Two load groups are used to provide sufficient power handling capability. Controller 110 provides signals to load group I 301 and load group II 302 via lines 304A and 304B, respectively.

The AC load test and battery test of the present invention require that the simulated load draw constant power from the backup system 30 being tested. Controller 110 controls the power drawn from the backup system 30 by monitoring the current and voltage levels and by control of rectifier 200 and load bank 300. As noted above, current monitor 24 provides current level signals to controller 110 via line 23 regarding the current level provided to rectifier 200 on bus 204 from the engine/generator 12. Controller 110 also monitors the line-to-line voltage between the lines of bus 204 via isolation transformer 47. Further, controller 110 monitors output voltage from rectifier 200 to load bank 300 via bus 203. In addition, controller 110 controls the operation (resistance) of load bank 300, and thus controller 110 can determine the initial current through load bank 300 by dividing the output voltage from rectifier 200 by the presently selected resistance value of load bank 300. Controller 110 is able to calculate load power using the well known equation of voltage times total current.

In the preferred embodiment, nonlinear and/or reactive effects are achieved by the control of the turn-on point of thyristor groups 201 and 202 and the control of the instantaneous resistance of load groups 301 and 302. For example, a non-linear load can be simulated by adjusting the turn-on point of thyristor group 201 or thyristor group 202, and by varying the resistance of load groups 301 and 302 within a cycle of the AC input waveform. Controller 110 selects the firing phase angle for the thyristors in thyristor groups 201 and 202 to obtain the desired nonlinear and/or reactive effect. Of course, it will be appreciated that changing the firing phase angle of rectifier 200 will change the simulated load so that it will be generally necessary to adjust the load bank 300 whenever the firing phase angle of rectifier 200 is adjusted. An apparent reactive load can be simulated by varying the resistance of load groups 301 and 302 within a cycle of the AC input waveform so that the output voltage and the current drawn are not in phase. Of course, a reactive load cannot be precisely provided by the above techniques because load groups 301 and 302 are resistive in nature, and are not energy storage (reactive) devices. For a linear, non-reactive load, thyristor groups 201 and 202 are turned on for the full AC waveform, and load groups 301 and 302 are adjusted to provide a constant resistance or a constant power draw as required.

Figure 7:
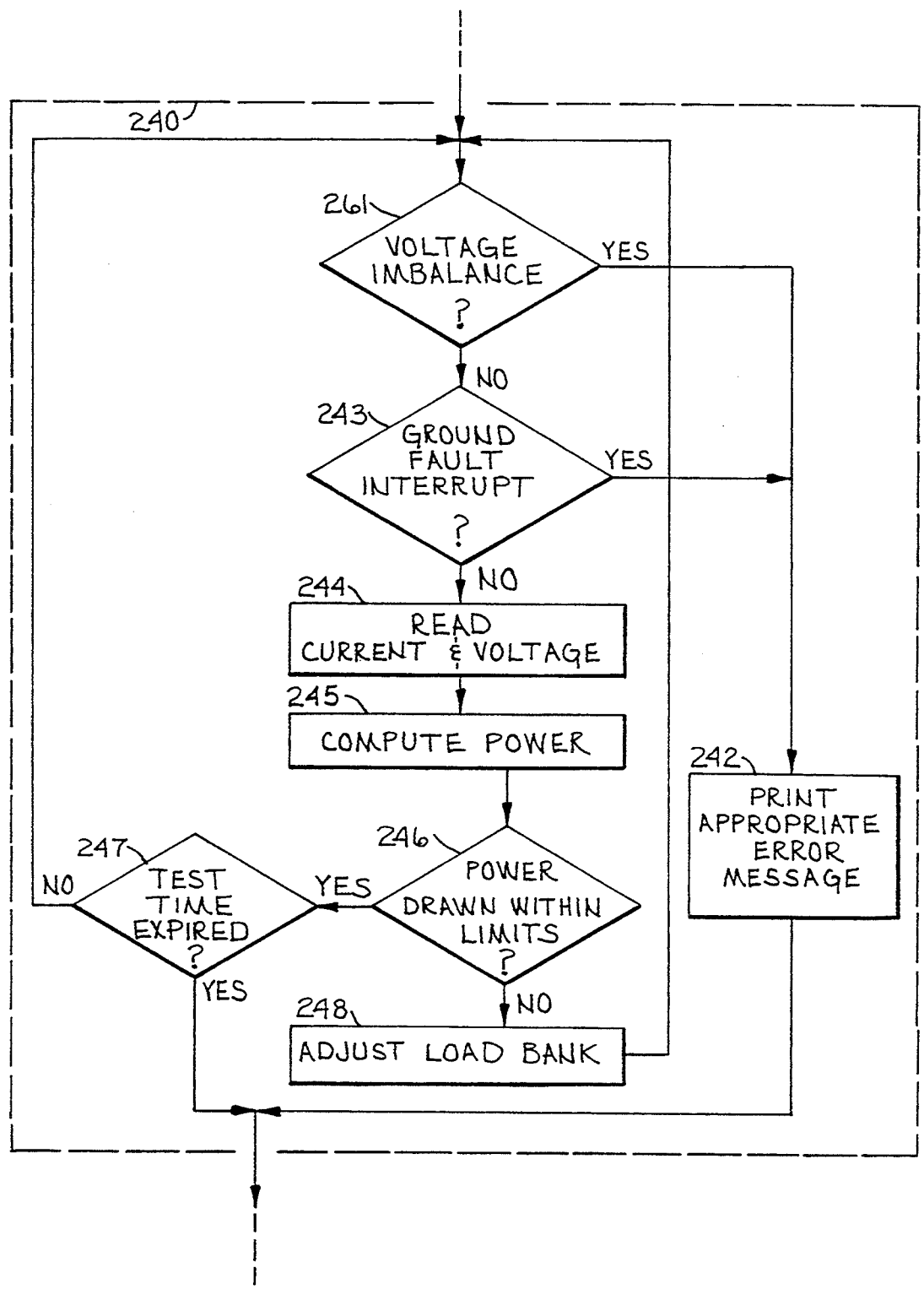
FIG. 7 is a flow chart illustrating the general method of the operation of the preferred embodiment in the battery test mode.

The load test system 100 may also be used to test and to recharge the battery set 14 of the backup system 30. FIG. 7 is a flow chart illustrating in greater detail the run test step 240 of the battery test mode flow chart shown in general in FIG. 4. At decision step 24 1, the battery set is checked for voltage imbalance. If there is a voltage imbalance, an appropriate error message is printed in step 242 and the test is ended if desired in step 55. If the voltage is not in imbalance, the battery set is checked for ground fault interrupt in step 243. As is well known, ground fault interrupt condition is detected by measuring the current through two battery lines (or terminals), and if the current readings are not equal, then a ground fault is present. Current monitor 125 measures the current through the battery lines 105 and provides this information to controller 110. If there is a ground fault interrupt, the appropriate error message is printed in step 242, and the test is ended in step 55. If there is no ground fault interrupt the current and voltage is read in step 244. The power is computed in step 245, and in decision step 246, the computed power is checked to see whether it is within limits. If it is not within limits, in step 248 the load bank is adjusted and steps 241–246 are repeated. If the power is within limits, decision step 247 checks whether the test time has expired. If the test time has expired, the test is ended in step 55. If the test time has not expired, steps 241–247 may be repeated.

The present invention tests the battery set as a unit under constant kilowatt conditions by adjusting the constant load characteristics of the simulated load given the instantaneous voltage. Referring to FIG. 5, when battery set 14 of backup power system 30 is to be tested, DC power is provided from battery set 14 on battery power bus 35 through the battery imbalance circuit 40 to input circuit breaker 102B. During the battery test, input circuit breaker 102B is closed, circuit breaker 102A is open, and DC power is provided to load bank 300 on DC power bus 105 and bus 203. Controller 110 monitors the voltage through remote voltage monitoring at the terminals of the battery set 14 under test, or at the DC input on the DC power bus 105 via line pair 106. Controller 110 also monitors the current level on DC power bus 105 through current monitor 125 which measures the current on both the positive and negative lines of bus 203. In the preferred embodiment, current monitor 125 comprises Hall effect window type DC current transducers providing noncontact measurement of DC bus current such as those sold by Ohio Semitronics, part no. CT3500-1, with excitation voltage of 5VDC at 150 mA, output sensitivity of 0.025mV/ADC, rated at 3500 amps. In testing the battery set 14 of a backup system 30, the present invention provides a simulated load by using controller 110 to configure load bank 300 to an initial desired constant load. Controller 110 monitors the output current and voltage of battery set 14. As the voltage drops, controller 110 reconfigures load bank 300 to maintain the load at the desired constant kilowatt conditions given the instantaneous voltage according to the well known formula of $R=V^2/P$.

Figure 8:
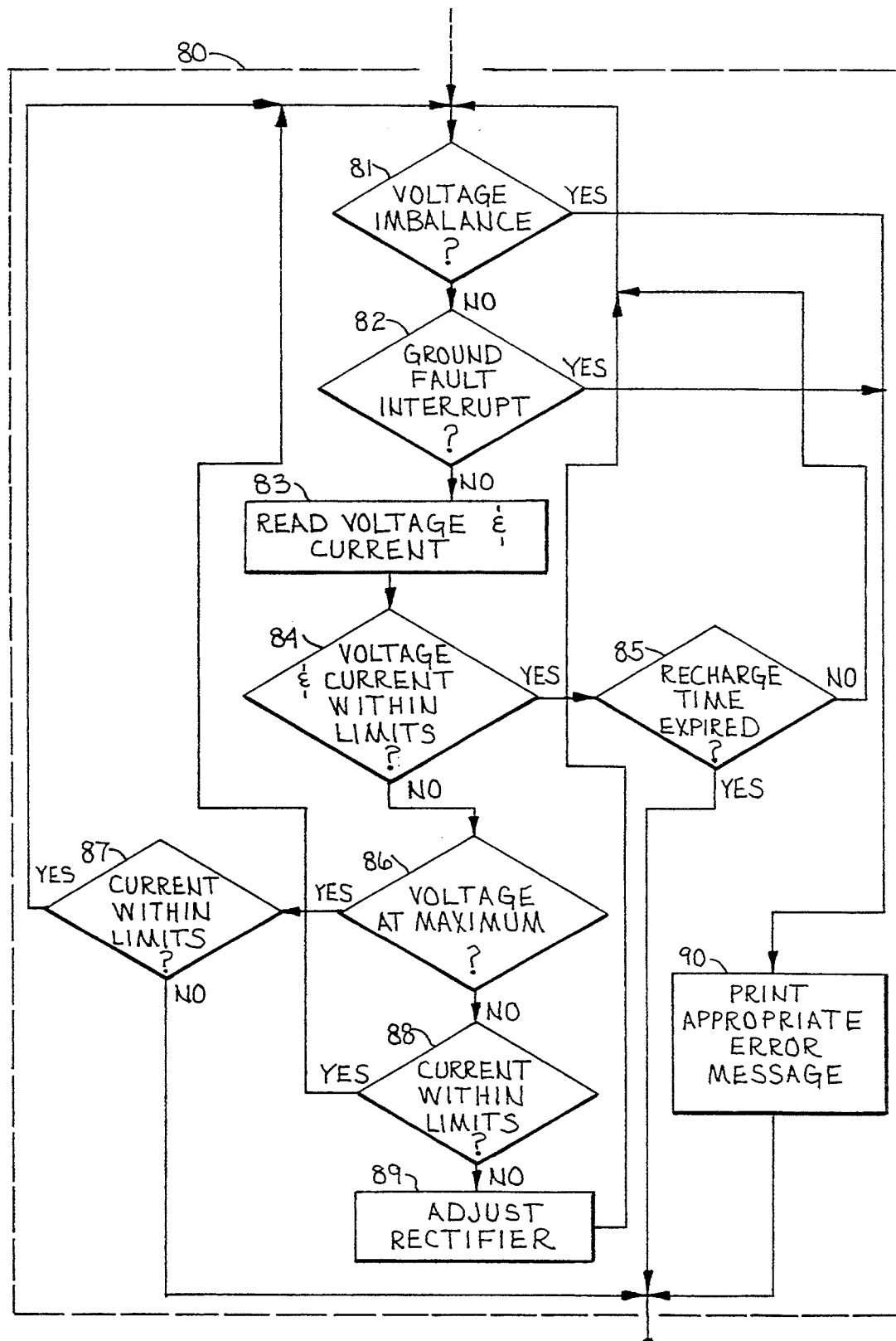
FIG. 8 is flow chart illustrating the general method of the operation of the preferred embodiment in the battery recharge mode.

The present invention also provides for recharging of the battery set 14 after testing. FIG. 8 is a flow chart illustrating in greater detail the run recharge step 80 of the battery recharge flow chart shown in general in FIG. 4. At decision step 81, the battery set is checked for voltage imbalance. If there is a voltage imbalance, an appropriate error imbalance message is printed in step 90 and the test is ended if desired in step 55. If the voltage is not in imbalance, the battery set is checked for ground fault interrupt in step 82. If there is a ground fault interrupt, the appropriate error message is printed in step 90, and the test is ended in step 55. If there is no ground fault interrupt, the current and voltage are read in step 83. In decision step 84, the voltage and current are checked to determine whether they are within limits. If they are not within limits, in step 86 the voltage is checked to see whether it is at maximum. If the voltage is at maximum, at decision step 87 the current is checked to see whether it is within limits. If the current is within limits, the voltage imbalance check in step 81 is repeated. If the current is not within limits, an appropriate error message is printed in step 90 and the battery recharge is ended in step 55. If the voltage at decision step 86 is not at a maximum, the current is checked to see whether it is within limits in decision step 88. If the current is within limits, the voltage imbalance check of step 81 is repeated. If the current is not within limits in step 88, the rectifier is adjusted in step 89, and the voltage imbalance check of step 81 is repeated. If the voltage and current are within limits in step 84, in decision step 85 the recharge time is checked to see whether it has expired. If it has expired, the recharge is ended in step 55. If the recharge time has not expired, the voltage imbalance check of step 81 is repeated.

Referring to FIG. 5, to recharge the battery set 14 in the preferred embodiment, controller 110 turns off load bank 300. Both circuit breakers 102A and 102B are closed. The battery set is recharged by AC power supplied from AC output 32 on AC power bus 204 through circuit breaker 102A, current monitor 24 and rectifier 200. After rectification of AC power by the rectifier 200, DC power is provided on DC power bus 203 and DC power bus 105 through current monitor 125 and battery imbalance circuit 40 to the battery set 14 on battery power bus 35. In the preferred embodiment, during battery set charging, controller 110 monitors the battery charging current through current monitor 125 and adjusts thyristor groups 201 and 202 of the rectifier 200 to keep the battery charging current within requisite limits. Controller 110 also monitors the voltage of the battery set by checking the voltage on bus 35 at times when thyristor groups 201 and 202 are turned off. After the battery set's voltage reaches a predetermined voltage for a time duration specified by the operator, which indicates that the battery set is fully charged, controller 110 turns off thyristor groups 201 and 202 of rectifier 200 and displays, on control/display panel 115, an indication that the recharging process has been completed.

Figure 9:
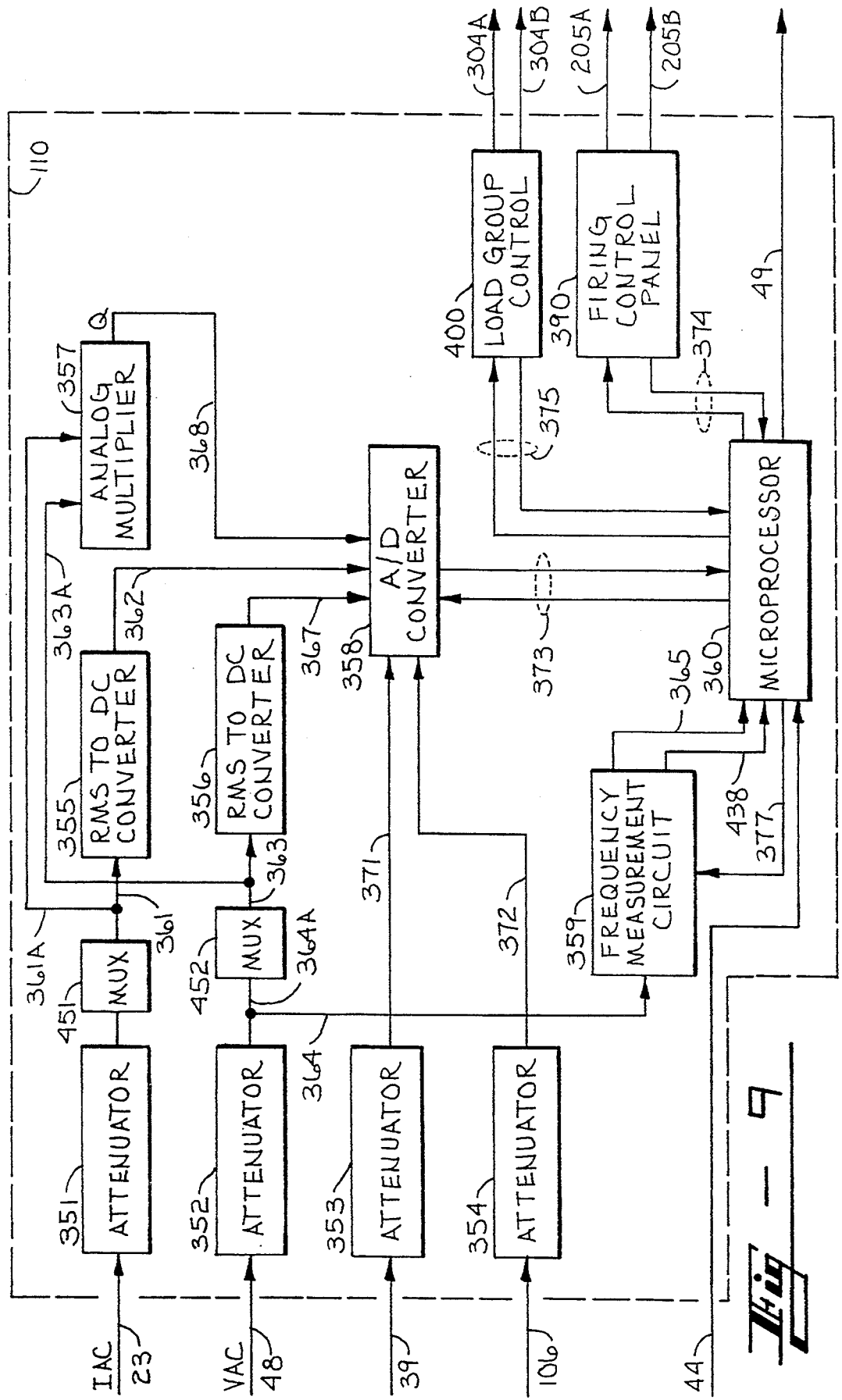
FIG. 9 is a block diagram of the controller of the preferred embodiment of the present invention.

FIG. 9 illustrates the elements comprising controller 110 of the preferred embodiment. Generally, controller 110 comprises four attenuators 351-354, two RMS-to-DC converters 355, 356, an analog multiplier 357, an A/D converter 358, a frequency measurement circuit 359, a microprocessor 360, a firing control panel 390 and a load group control 400.

Attenuators 351-354 generally comprise a resistor network, and may include a variable resistance for precise control of the attenuation. AC signals from current monitor 24 are provided on bus 23 to attenuator 351 for attenuation in a manner well known to those skilled in the art. Attenuator 351 provides a separate attenuator for each of the signals provided on bus 23. These attenuated signals are then multiplexed by multiplexer 451 to provide a current signal on line 361 to RMS-to-DC converter 355 and on line 361A to one input of analog multiplier 357. Analog multiplier 357 is a precision 4 quadrant part no. AD534L, manufactured by Analog Devices of Norwood, Mass. The RMS-to-DC converter 355 converts the RMS value of the AC signal provided to it to a DC value in a manner well known to those skilled in the art. Converters 355, 356 are true RMS converters, part no. AD536AK, manufactured by Analog Device of Norwood, Mass. Output from converter 355, which represents the effective value (IEFF) of the current on bus 204, is provided to A/D converter 358 on line 362. Individual A/D converters may be used for each analog signal or the analog signals may be selected through a switching device, such as a multiplexer, so that a single A/D converter may be used for the A/D conversion process.

AC signals from isolation transformer 47 are provided on bus 48 for attenuation to attenuator 352. Attenuator 352 also provides a separate attenuator for each of the signals provided on bus 48. These attenuated signals are provided to frequency measurement circuit 359 on bus 364 and to multiplexer 452 on bus 364A. The attenuated signals on bus 364A are multiplexed by multiplexer 452 to provide voltage signals on lines 363 and 363A. Voltage signals are provided to RMS-to-DC converter 356 on line 363 and to one input of analog multiplier 357 on line 363A. Analog multiplier 357 multiplies the current signals provided to it on line 361A with the voltage signals provided to it on line 363A in a manner well known to those skilled in the art and provides the resulting power calculation signals to A/D converter 358 on line 368. The signals provided on line 363 to RMS-to-DC converter 256 are converted, and then signals corresponding to the effective value (VEFF) of the AC line voltage on bus 204 are provided to A/D converter 358 on line 367.

As noted above, attenuated signals are provided on bus 364 to frequency measurement circuit 359. Frequency measurement circuit 359 provides information regarding the signals on bus 204 to microprocessor 360. In the preferred embodiment, microprocessor 360 comprises an Intel 386-DX, manufactured by Intel of Santa Clara, Calif.

Figure 13:
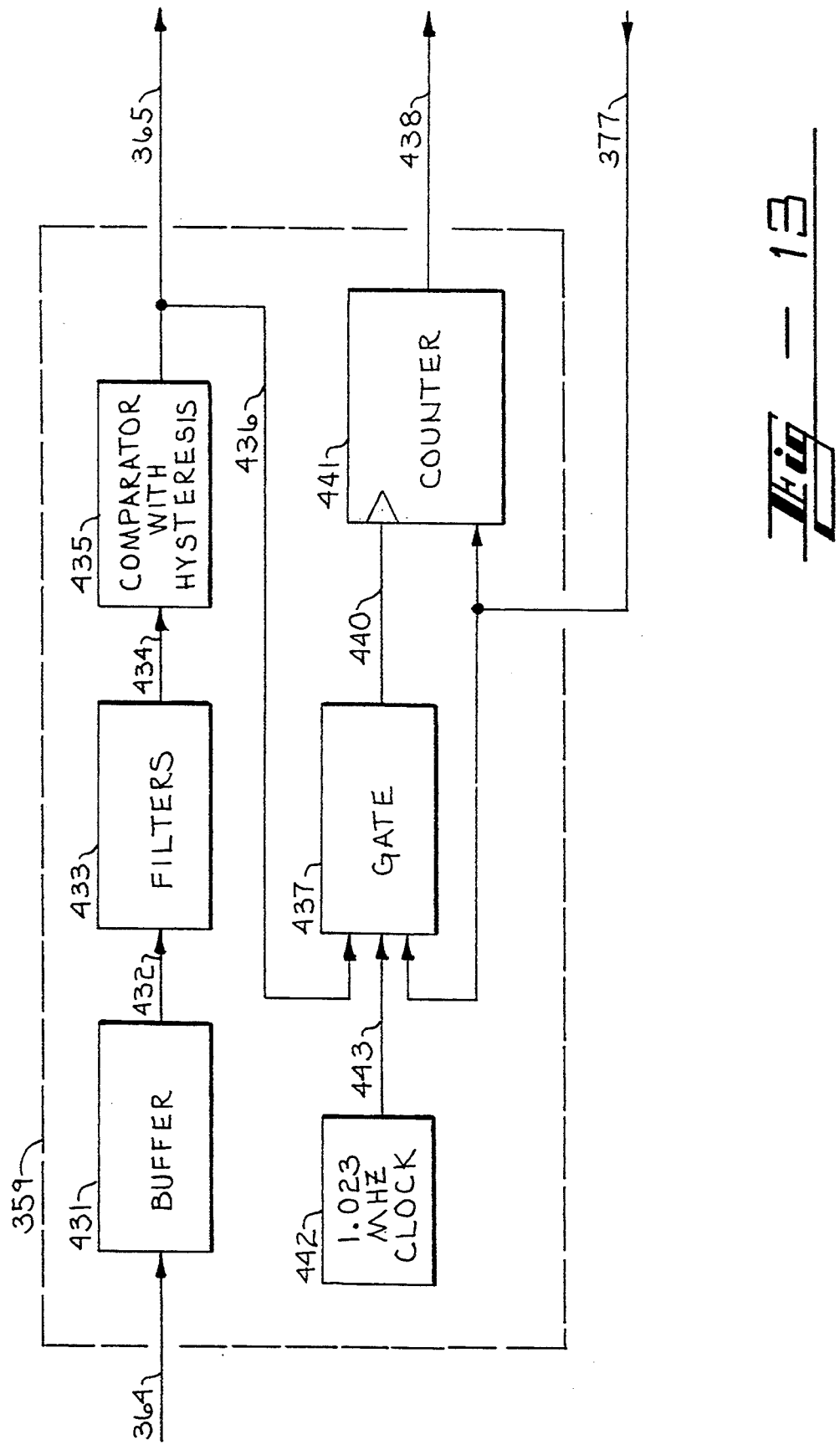
FIG. 13 is a block diagram of the frequency measurement circuit as used in the preferred embodiment of the present invention.

As illustrated in FIG. 13, frequency measurement circuit 359 provides frequency information through the use of filters for waveform restoration to guarantee accurate zero crossing capture and accurate frequency measurement. In the preferred embodiment, frequency measurement circuit 359 generally comprises a front-end buffer 431, filters 433, a comparator with hysteresis 435, a 1.023 MHz oscillator 442, a gate 437, and a counter 441. The front-end buffer 431 receives signals representing the "A" phase potential on line 364 and, after buffering the signals, provides the signals on line 432 to filters 433. The filters 433 of the preferred embodiment comprise a 65 Hz, $-3$ dB Chebyshev low pass filter followed by a $-3$ dB Chebyshev high-pass filter with a 45 Hz cutoff frequency. The purpose of the filtering is to guarantee accurate position of zero-crossings because the source waveform will be distorted under normal operating conditions.

The filtered signals are provided on line 434 to comparator with hysteresis 435 which converts the analog output of filters 433 to a digital signal. Hysteresis, as is well known in the art, reduces or eliminates the effects of noise. The digital signal from comparator 435 is provided on line 365 to microprocessor 360 and on line 436 to gate 437. The signal on line 365 is checked by software to determine if it is being clocked or toggled. The signal should toggle at the line frequency. If the signal is not toggling then the line frequency cannot be measured. If the signal is toggling then a valid frequency measurement can be made.

The signal provided on line 436 provides gate timing for a clock 442. This gated clock is fed to counter 441 via line 440. Every other cycle gate 437 and counter 441 are read by microprocessor 360, reset via line 377, and then the gated counter is allowed to count again. The signal provided on line 436 is gated with the clock signal on line 443 by gate 437 to provide a gated clock signal on line 440 to counter 441. Counter 441 counts the number of gated clock pulses. When the output of comparator 435 is high then clock pulses are provided to counter 441. When the output of comparator 435 is low then the clock pulses are blocked. In addition, the low output on line 365 signals microprocessor 360 that the counting portion of a half-cycle has been completed, that microprocessor 360 should disable gate 437 to prevent additional clock pulses from affecting the count, and that microprocessor 360 should read the count in counter 441. Once microprocessor 360 has read the count, it resets counter 441 and enables gate 437 so that comparator 435 can again cause clock pulses to be provided to counter 441. The number of these pulses is counted to determine the pulse width of a half-cycle of the input waveform on line 364. This information is used by microprocessor 360 to determine the frequency of the input waveform. By using a high-frequency clock and successive software averaging of the pulse count, accurate cycle-by-cycle frequency measurement can be made.

DC signals from current monitor 125 are provided to attenuator 353 on bus 39, and DC signals from DC bus 105 are provided to attenuator 354 on bus 106. Attenuated signals from attenuator 353 and attenuator 354 are provided for conversion to A/D converter 358 on lines 371 and 372, respectively. A/D converter 358 provides signals to and receives signals from microprocessor 360 on line pair 373.

During backup system testing, the present invention simulates a load matching the facility's characteristics. In the preferred embodiment, the microprocessor 360 and firing control panel 390 of controller 110 provide for a simulated nonlinear and/or reactive load of the serviced facility 10 by adjusting rectifier 200 for the desired turn-on point. Microprocessor 360 provides signals to and receives signals from firing panel 390 on line pair 374. Signals from firing control panel 390 are provided to thyristor group 201 of rectifier 200 on line 205A and to thyristor group 202 on line 205B. Rectifier 200 is discussed in detail below in connection with FIG. 10. In the preferred embodiment, firing control panel 390 comprises an Enerpro model FCOG-6100-03-1-6-48-1 three phase main firing board and an FCOAUX-60 slave firing board. When the system is in an AC load test sequence, the firing angle is controlled by a 0–10 V DC analog signal from microprocessor 360, which signal is related to desired load and test power factor. In the present invention's battery recharge mode, the preferred embodiment uses a VRCL-3-1-2-1 regulator card of the main firing board of firing panel 390 to provide automatic control of firing angle. In an alternate embodiment, the firing panel 390 comprises a parallel-data digital output control card to control thyristor gates via gate drive amplifiers and trigger transformers to provide gate drive isolation. Gate firing is controlled by software initiation.

Microprocessor 360 provides control signals to capacitive load circuit 28 on line 49. Capacitive load circuit 28 is described in connection with FIG. 5.

In the preferred embodiment, microprocessor 360 and load group control 400 of controller 110 provide for the simulated linear load of the serviced facility 10 by adjusting load bank 300 for the desired load. Microprocessor 360 provides signals to load group control 400 on line 375. Power contactor closed signals are returned to the processor 360 on line 375 Load group control 400 provides signals to load group I 301 of load bank 300 on line 304A and provides signals to load group II 302 on line 304B. In the preferred embodiment, load group control 400 comprises a load controller for each load group in load bank 300. Thus, load group control 400 comprises two identical load controllers.

Figure 10:
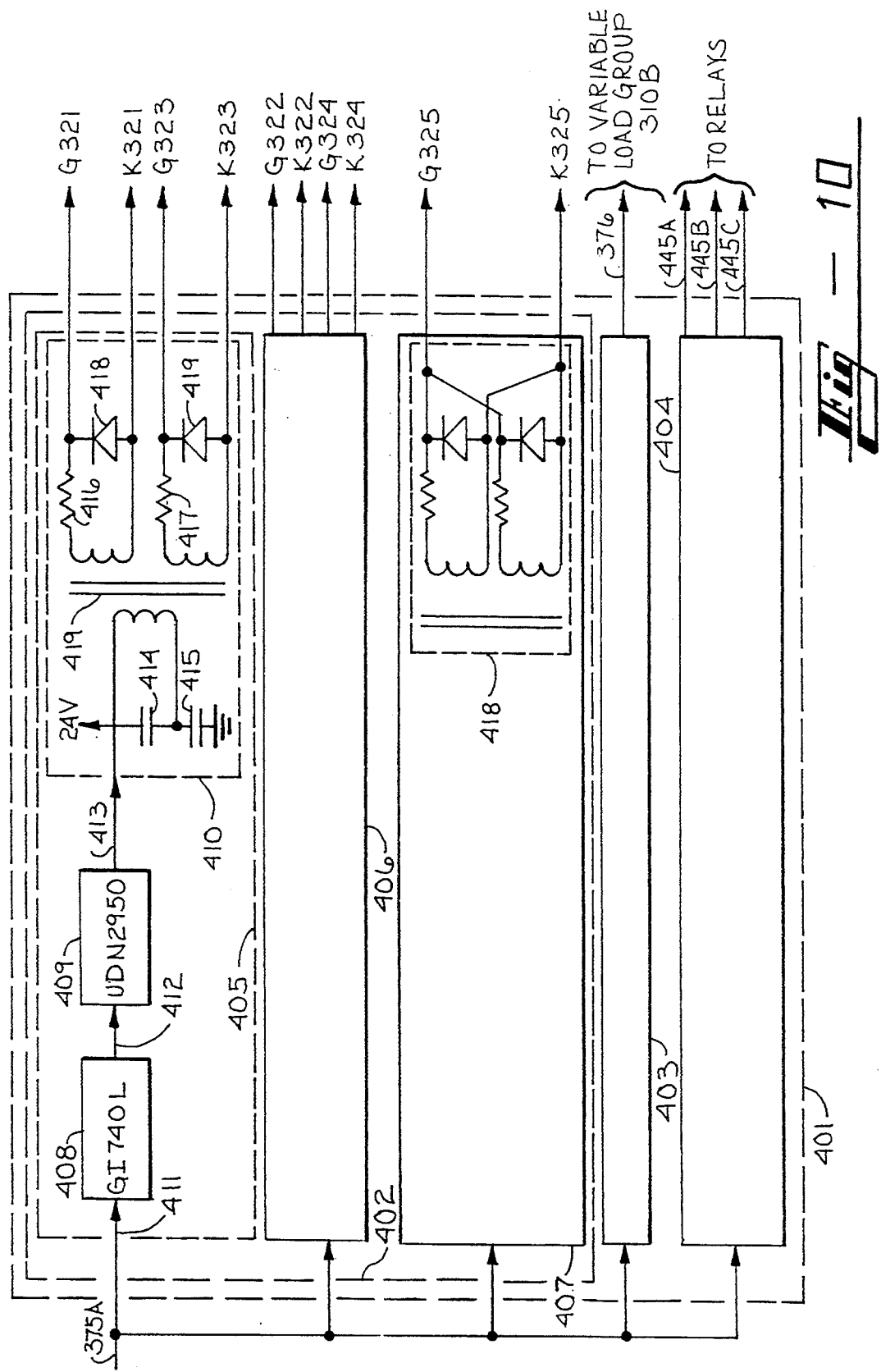
FIG. 10 is a block diagram of a load controller as used in the preferred embodiment of the present invention.

Load controller 401 is illustrated in FIG. 10. Signals from microprocessor 360 are provided to load controller 401 on line 375A. Load controller 401 comprises: thyristor controller 402 which controls operation of variable load group 310A; thyristor controller 403 which controls operation of variable load group 310B and is identical to thyristor controller 402; and relay controller 404 which controls operation of relays 345A–345C.

In the preferred embodiment, thyristor controller 402 comprises three similar thyristor control panels, 405 407. Thyristor control panel 405 is used to control operation of thyristors 321 and 323 (FIG. 12) of variable load group 310A. Thyristor control panel 406 is identical to thyristor control panel 405, except that panel 406 is used to control operation of thyristors 322 and 324 (FIG. 12) of variable load group 310A. Thyristor control panel 407 is used to control operation of thyristor 325 (FIG. 12) of variable load group 310A. Thyristor control panel 405 comprises an integrated circuit GI740L 408, an integrated circuit UDN2950 409, and a transformer/rectifier circuit 410. Integrated circuits 408 and 409 are manufactured by General Instruments, Hicksville, N.Y. and Sprague Electric Company, Mansfield, Mass. respectively. Signals from microprocessor 360 are provided to load group control I 401 on line 375A, and to circuit 408 of thyristor control panel 405 on line 411. The output from circuit 408 is provided to circuit 409 on line 412. The output of circuit 409 is provided on line 413 to drive transformer/rectifier circuit 410. Transformer/rectifier circuit 410 comprises a transformer 419, resistors 416 and 417, capacitors 414 and 415, and diodes 418 and 419. The primary of transformer 419 is connected between line 413 and the junction of two series capacitors 414, 415, each of which has a value of 0.1 microfarads in the preferred embodiment, the capacitors being connected between circuit ground and a +24 volt circuit power supply line. Transformer 419 has two secondaries, one of which drives commutating thyristor 321 in variable load group 310A of load bank 300, and the other drives the opposite commutating thyristor 323. As shown in FIG. 10, "G" indicates gate connection to a particular thyristor gate and "K" indicates cathode connection. Each secondary of transformer 419 has a current limiting resistor 416, 417, with a value of 30 ohms, associated with it. A diode, 418, 419, is connected in parallel with the series combination of a secondary winding and its associated current limiting resistor, 416, 4 17, respectively, to prevent an excessive reverse voltage from being applied to the gate of a thyristor. An identical thyristor control panel 406 is used to control thyristors 322 and 324.

As further illustrated in FIG. 10, a third similar thyristor control panel 407 is used to control thyristor 325 of variable load group 310A. It should be noted that the outputs of the two diode resistor secondary winding transformer 418 combinations of transformer/rectifier circuit 418 combination in thyristor control panel 407 are connected in parallel to provide adequate drive for thyristor 325.

Thyristor controller 403 controls operation of variable load group 310B and is identical to thyristor controller 402, and thus will not be described herein. Relay control 404 controls operation of relays 345A–345C by signals provided on lines 445A –445C, respectively, in a manner well known to those skilled in the art. Relay control 404 simply provides buffering between the output of microprocessor 360 and relays 345A–345C. The operation of relays 345A–345C is described in connection with load bank 300 illustrated in FIG. 12.

Figure 11:
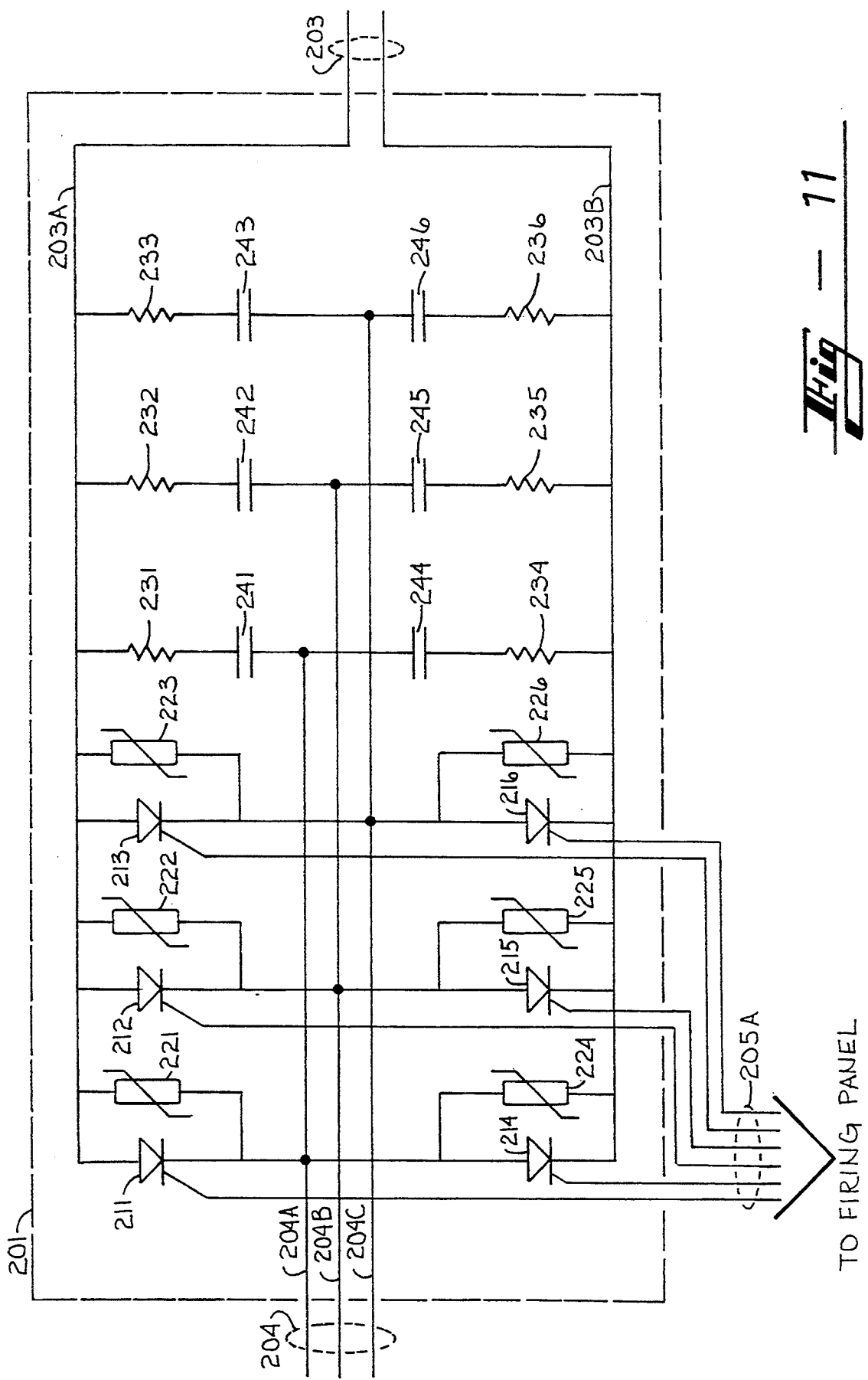
FIG. 11 is a schematic diagram of a thyristor group as used in the preferred embodiment of the present invention.

FIG. 11 is a schematic diagram of thyristor group 201 of the rectifier 200 of the preferred embodiment. Thyristor group 202 is identical thereto. AC power is delivered to thyristor group 201 on AC power bus 204. Thyristor group 201 selectively rectifies the power on AC bus 204 to provide DC power on DC power bus 203. Thyristor group 201 comprises six silicon controlled rectifier (SCR) thyristors, 211 through 216, such as Power Semiconductors, Inc., Hicksville, N.Y., P/N Z-1600. The gate terminal of each of the thyristors 211–216 is connected independently via lines 205A to firing control panel 390 of controller 110. During the AC load test of the backup system 30, thyristors 211–216 are triggered by firing control panel 390 in a manner which simulates the linear and non-linear characteristics of the actual load.

The anode of each thyristor 211, 212, and 213 is connected to the negative line 203A of bus 203. The cathode of each thyristor 211, 212, and 213 is connected to line 204A, 204B, and 204C, respectively, of bus 204. The anode of each thyristor 214, 215, and 216 is connected to line 204A, 204B, and 204C, respectively of bus 204. The cathode of each thyristor 214, 215, and 216 is connected to the positive line 203B of bus 203. Thyristors 211–216 form a controllable 3-phase full-wave rectifier. A metal oxide varistor (MOV) 221–226 is connected in parallel with each thyristor 211–216, respectively. These MOV's protect thyristors 211–216 from surge voltages. In the preferred embodiment, the varistors are type Z550DA80C, which have a breakdown voltage of 550 volts and an energy dissipation rating of 200 joules.

A snubber circuit, consisting of a resistor 231–236 in series with a corresponding capacitor 241–246, is connected in parallel with each thyristor 211–216, respectively. The snubber limits the rate of voltage rise across the thyristors so as to prevent unwanted dV/dt turn-on of the thyristors. In the preferred embodiment, each snubber resistor has a value of 5 ohms and each snubber capacitor is 0.25 microfarad oil filled 1400 V capacitor.

As noted above, the rectifier 200 of the load test system 100 is used to simulate a reactive load during a test of the AC load test of backup system 30, and is also used in connection with recharging the battery set. In either case, in the preferred embodiment, thyristor group 201 with or without thyristor group 202, as determined by the controller 110, selectively rectifies the power on AC bus 204 to provide DC power on DC power bus 203. Based upon the desired simulated load, firing panel 390 provides signals to the gate terminals of thyristors 211–216 to trigger each thyristor at necessary points on the AC voltage waveform so as to simulate the desired linear and non-linear characteristics of the serviced facility's load. During the AC load test, the firing angles of thyristor groups 201 and 202 are controlled by 0–10 V DC analog signals from controller 110. The signals correspond to the desired simulated load and test power factor parameters. Thyristor group 202 is used whenever the desired current exceeds the rating of thyristor group 201. Of course, a single thyristor group, having a sufficiently high current rating, could be used but more gate device current may be required and the total cost may be higher.

In the preferred embodiment, thyristor groups 201 and 202 are operated electrically with individual gate drive signals originating from firing control panel 390 of controller 110. Firing control panel 390 is discussed in further detail in connection with FIG. 9. In the preferred embodiment, thyristor groups 201 and 202 are controlled through gate drive amplifiers and trigger transformers to provide gate drive isolation. Gate firing is controlled by software initiation.

Figure 12:
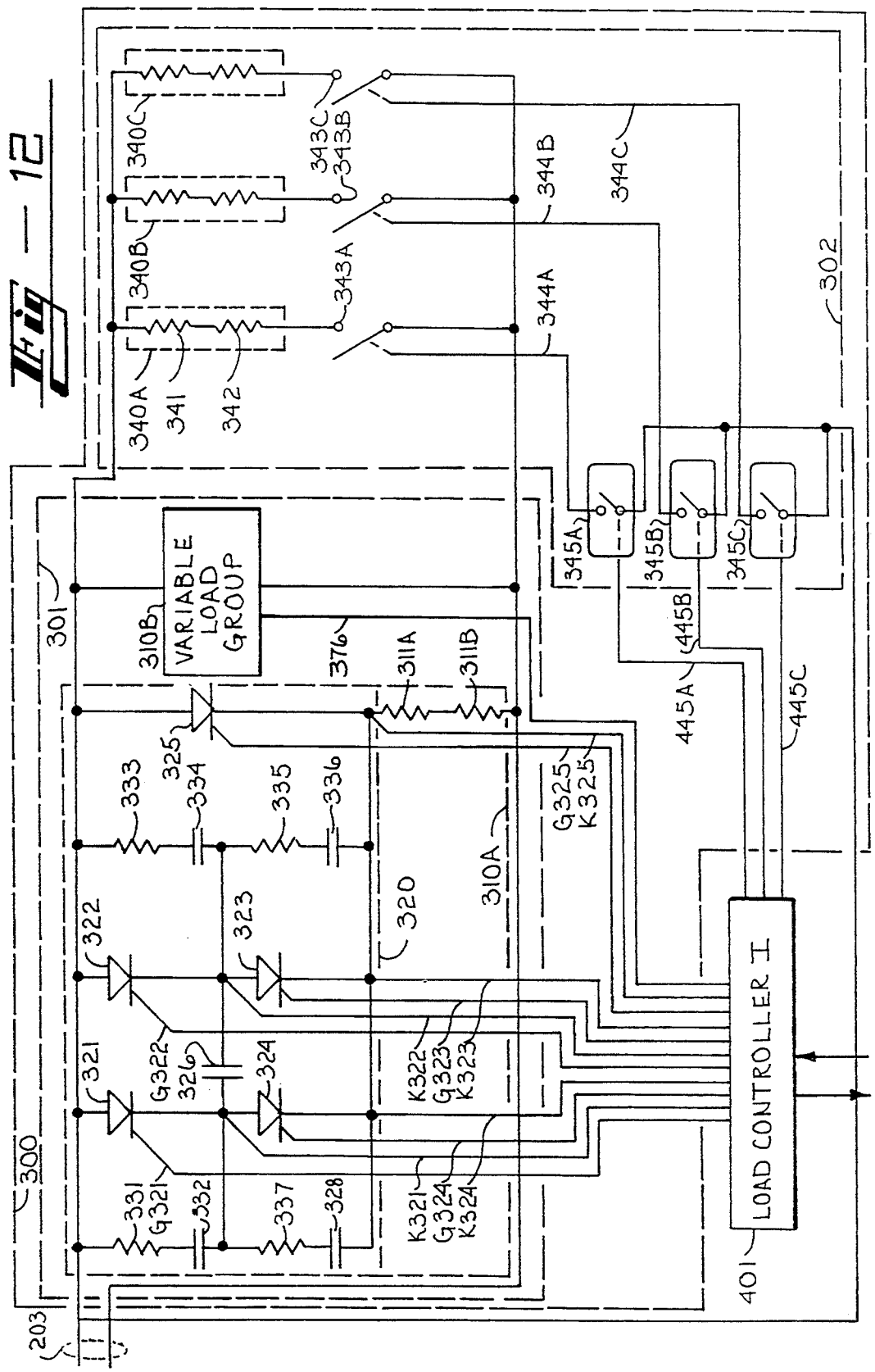
FIG. 12 is a schematic diagram of the load bank of the preferred embodiment of the present invention.

FIG. 12 is a schematic diagram of load bank 300 of the preferred embodiment. When the load test apparatus 100 is testing the engine/generator of a backup power system 30, the controller 110 configures the load bank 300 to simulate the serviced facility's constant, linear, nonlinear and/or reactive load characteristics, based upon operator input.

In the battery test mode, the present invention tests the battery set as a unit under either constant kilowatt or constant current load conditions. The controller 110 initially configures the load bank 300 for a certain power level. Then, controller 110 monitors the discharge voltage level from the battery set and adjusts the load bank's load characteristics so as to maintain the desired power level at a constant value regardless of the instantaneous voltage of the battery set 14.

DC power is delivered to load bank 300 on DC power bus 203 from the rectifier 200. In the preferred embodiment, load bank 300 generally comprises load group 301 in parallel with load group 302. Load group 301 comprises generally two identical independently variable load groups 310A and 310B connected in parallel. Load group 310B is used when load group 310A, above, cannot draw the desired current. Only variable load group 310A will be described herein. Variable load group 310A comprises generally the series combination of two power grid resistors, 311A and 311B, and a chopper circuit 320. In the preferred embodiment, each power grid resistor is Nichrome ribbon of 0.33 ohms and 300 kilowatts, manufactured by Cutler Hammer, and the chopper circuit 320 is a thyristor-based switched capacitor circuit. The chopper circuit 320 comprises five silicon controlled rectifier (SCR) thyristors, 321 through 325. In the preferred embodiment, thyristors 321 through 324 are rated at 40 microsecond turn off time, 1000 volts and 900 amps, such as the General Electric/Powerex, of Youngwood, Pa., type C448P, and thyristor 325 is rated at 1200 volts and 1600 amps, and turn off time of 25 microsecond such as the type C458PB. Thyristors 321 and 324 are connected in series. Thyristors 322 and 323 are also connected in series with respect to each other, but as a pair, are connected in parallel with the series combination of thyristors 321 and 324. The junction point of thyristors 321 and 324 is connected to the junction point of thyristors 322 and 323 through the parallel combination of three 33 microfarad, 1200 volt commutating capacitors 326.

In the preferred embodiment, a snubber circuit is connected in parallel with each of thyristors 321–324. Each snubber circuit comprises a resistor 331, 333, 335, 337 connected in series with a corresponding capacitor 332, 334, 336, 338, respectively. Thyristor 325 is connected in parallel with the series combination of thyristors 321 and 324 and the series combination of thyristors 322 and 323. The gate and cathode terminals of each of thyristors 321–325 are independently connected to load controller 401 of controller 110. As discussed in connection with FIG. 10, "G" indicates the gate connection to a particular thyristor and "K" indicates the cathode connection. It will be appreciated that a DC voltage is present across the conductor of bus 203. Therefore, once load controller 401 turns on thyristor 325, thyristor 325 will stay on because there is no natural zero-current point. Controller 110 therefore uses thyristors 321–324, in the well-known switched capacitor configuration, to turn off thyristor 325. Thyristors 321–325 are triggered by load controller 401 as necessary to achieve the desired load characteristic.

Control of current through load group 310A is achieved by two methods. When a very small current is required, thyristors 321 and 323 are initially turned on so that current flows through resistor 311 and charges capacitor 326. Then, thyristors 322 and 324 are turned on so that current flows through resistor 311 and capacitor 326, dissipates the previous charge, and then charges capacitor 326 in the opposite polarity. Then, thyristors 321 and 232 are turned on again. The net result is a small current flow, determined by the switching rate, which is dissipated as heat by resistor 311. In the preferred embodiment, the switching rate varies from 30 to 500 Hz as determined by the load requirements.

When a larger current is required, thyristor 325 is turned on, thus allowing current to flow directly through resistor 311, rather than being limited by capacitor 326. Thyristors 321–324 in conjunction with capacitor 326 are used to turn off thyristor 325. The resulting current flow is therefore determined by the on-time of thyristor 325. In the preferred embodiment, thyristor 325 on-time is variable, and the duty cycle is varied by using well known pulse width modulation (PWM) firing techniques In the preferred embodiment, the frequency is fixed at 500 Hz, and the on-time of thyristor 325 is selected based on load requirements.

For duty cycles below 10%, thyristor 325 is not used for power control. Instead, thyristors 321–324 are switched on and off as described above to achieve the desired power consumption. The technique of using commutating thyristors and capacitors for low power consumption is described in an article by Victor Wouk, entitled "High Efficiency, High Power, Load Insensitive DC Chopper for Electronic Automobile Speed Control," which appeared in IEEE Conference Record of Fourth Annual Meeting of Industry and General Applications Group, pp. 393–402 (1969), and which is incorporated herein.

In the preferred embodiment, load group 302 comprises three fixed load subgroups, 340A, 340B and 340C, connected in parallel. Preferably, all three fixed load subgroups are the same, and therefore only fixed load subgroup 340A will be described in detail. Fixed load subgroup 340A comprises the series combination of two power grid resistors 341,342 and a power contactor 343A. Power grid resistors 341,342 are each rated at 0.33 ohms and 300 kilowatts. Power contactor 343A is connected through line 344A to relay set 345A which is, in turn, connected to controller 110. Similarly, the power contactors 343B and 343C of the other fixed load subgroups 340B and 340C are connected through lines 344B and 344C, respectively, to relay sets 345B and 345C, which are also, in turn, connected to controller 110 through load controller 401. It will be appreciated that a microprocessor, such as that in controller 110, cannot directly drive a high current power contactor such as 343A, 343B or 343C. Therefore, relay sets 345A, 345B and 345C comprise high-sensitivity, low current relays and a relay power supply and drive the higher current power contactors 343A, 343B and 343C necessary to handle the current drawn by fixed load subgroups, 340A, 340B, and 340C. In the preferred embodiment, power contactors 343A–343C are each rated to switch 1000 amps at 750 volts DC.

By selectively triggering the chopper circuits of the variable load groups 310A and 310B, and by configuring the fixed load subgroups 340A, 340B and 340C, controller 110 can adjust the simulated load to match the load characteristics of the serviced facility and can adjust the load as necessary during a battery test to maintain a constant kilowatt load condition.

For testing the battery set, the operator keys in the desired constant load power at control/display panel 115. Controller 110 will cause relays/contactors 345A and 343A, for example, to connect load subgroup 340A to bus 203. Controller 110 then multiplies the battery voltage and the battery current to determine the load power. As the battery set voltage falls off, controller 110 will turn thyristor 325 on for a longer time period so as to increase the current and maintain a constant load power, cause similar thyristors in load group 302 to turn on for a longer time period so as to further increase the average current, and turn on additional fixed loads, such as loads 340B and 340C.

It will be appreciated from the above that the present invention provides a method and an apparatus for testing an engine/generator under a realistic load, testing a battery set under a realistic load, and recharging the battery set after testing, all while allowing these components to continue to fully function as a backup power system. The present invention uses a thyristor-switched resistive load bank, a filter capacitor, and a switched rectifier circuit to simulate a desired linear, non-linear, or reactive load. Switching times for the rectifier circuit and switching rates for the load bank are determined by a microprocessor by using empirically determined equations and/or tables based upon user-provided load characteristics. This data is gathered by, for example, setting a first turn-on point for rectifier 200, setting a first resistance for load bank 300, and measuring the current drawn and the power factor, repeating these measurements for the range of turn-on points, repeating these measurements with capacitor load circuit 28 enabled.

While this invention has been described in detail with particular reference to preferred embodiments thereof, it will be understood that variations and modifications can be effected within the spirit and scope of the invention as described hereinbefore and as defined in the appended claims.

I claim:

1. An apparatus for testing an AC power source by simulating a load with desired characteristics, comprising:
   a control panel for providing input signals in response to user selections, said selections corresponding to said desired characteristics of said load to be simulated;
   a rectifier connected to said AC power source and responsive to first control signals for rectifying power provided by said AC power source;
   a load bank connected to said rectifier for presenting a selectably variable load responsive to second control signals;
   means responsive to current drawn by said load bank for providing load current signals;
   means responsive to the voltage across said load bank for providing load voltage signals; and
   a controller responsive to a product of said load current signals and said load voltage signals, and further responsive to said input signals, for providing said first control signals and said second control signals to cause said load bank to simulate said load with said desired characteristics.

2. The apparatus of claim 1 wherein said controller simulates predetermined non-linear load characteristics by causing said rectifier to rectify said power at selected points on the AC waveform.

3. The apparatus of claim 1 wherein said controller simulates predetermined reactive load characteristics by causing said rectifier to rectify said power at selected points on the AC waveform.

4. The apparatus of claim 1 wherein said load controller simulates predetermined linear load characteristics by causing said load bank to draw predetermined load current when a predetermined load voltage is present.

5. The apparatus of claim 1 wherein said rectifier comprises a thyristor group.

6. The apparatus of claim 1 wherein said load bank comprises a resistor connected in series with a thyristor switch.

7. The apparatus of claim 6 wherein said load bank further comprises a second resistor connected in series with a relay switch, said relay switch being responsive to said second control signals.

8. An apparatus for testing a DC power source by simulating a load with desired characteristics, comprising:
   a control panel for providing input signals in response to user selections, said selections corresponding to at least either predetermined parameters of said DC power source or desired characteristics of said load;
   a load bank connected to said DC power source and responsive to control signals for presenting a selectably variable load to said DC power source;
   a current monitor for providing current level signals by monitoring the current provided by said DC power source;
   a voltage monitor for providing voltage level signals by monitoring the voltage provided by said DC power source; and
   a controller responsive to a product of said current level signals and said voltage level signals, and further responsive to said input signals, for providing said control signals to said load bank to test said DC power source according to said predetermined parameters of said DC power source or said desired characteristics of said load by causing said load bank to draw a constant power.

9. The apparatus of claim 8 wherein said load bank comprises a resistor connected in series with a thyristor switch.

10. The apparatus of claim 9 wherein said load bank further comprises a second resistor connected in series with a relay switch, said relay switch being responsive to said second control signals.

11. An apparatus for recharging a DC power source with an AC power source, comprising:
    a control panel for providing input signals in response to user selections, said selections corresponding to predetermined parameters of said DC power source;
    a current monitor for monitoring current level provided to said DC power source and for providing current level signals;
    a voltage monitor for monitoring voltage level provided to said DC power source and for providing voltage level signals;
    a rectifier connected to said AC power source and responsive to control signals for providing DC power to said DC power source by rectifying AC power provided by said AC power source; and
    a controller responsive to a product said current level signals and said voltage level signals, and further responsive to said input signals, for providing said control signals to said rectifier to cause said DC power source to be charged according to said predetermined parameters of said DC power source.

12. The apparatus of claim 11 wherein said rectifier comprises a thyristor group.

13. An apparatus for testing a DC power source by simulating a load with desired characteristics and then recharging said DC power source with an AC power source, comprising:
    a control panel for providing input signals in response to user selections, said selections corresponding to nominal parameters of said DC power source to be tested and to said desired characteristics of said load to be simulated;
    a load bank responsive to first control signals for presenting a selectably variable load having said desired characteristics to said DC power source;
    a current monitor for providing current level signals by monitoring the current provided by said DC power source during testing and by monitoring the current provided to said DC power source during recharging;
    a voltage monitor for providing voltage level signals by monitoring the voltage provided by said DC power source during testing and by monitoring the voltage provided to said DC power source during recharging;
    a rectifier connected to said AC power source and responsive to second control signals for providing DC power to aid DC power source by rectifying AC power provided by said AC power source during recharging; and
    a controller responsive to a product of said current level signals and said voltage level signals, and further responsive to said input signals, for providing said first control signals to cause said load bank to simulate said load with said desired characteristics and for providing said second control signals to said rectifier to cause said DC power source to be charged according to said nominal parameters of said DC power source.

14. The apparatus of claim 13 wherein said load bank comprises a resistor connected in series with a thyristor switch.

15. The apparatus of claim 13 wherein said load bank further comprises a second resistor connected in service with a relay switch, said relay switch being responsive to said second control signals.

16. The apparatus of claim 13 wherein said rectifier comprises a thyristor group.

* * * * *